(12) United States Patent
Hunt et al.

(10) Patent No.: US 7,960,713 B2
(45) Date of Patent: Jun. 14, 2011

(54) EDGE-CONTACTED VERTICAL CARBON NANOTUBE TRANSISTOR

(75) Inventors: Brian Hunt, La Crescenta, CA (US); James Hartman, San Diego, CA (US); Michael J. Bronikowski, Tujunga, CA (US); Eric Wong, Los Angeles, CA (US); Brian Y. Lim, Simi Valley, CA (US)

(73) Assignee: Etamota Corporation, Pasadena, CA (US)

( * ) Notice: Subject to any disclaimer, the term of this patent is extended or adjusted under 35 U.S.C. 154(b) by 16 days.

(21) Appl. No.: 12/346,513

(22) Filed: Dec. 30, 2008

(65) Prior Publication Data
US 2009/0166686 A1    Jul. 2, 2009

Related U.S. Application Data

(60) Provisional application No. 61/018,426, filed on Dec. 31, 2007.

(51) Int. Cl.
*H01L 29/78*    (2006.01)
(52) U.S. Cl. .............. 257/4; 257/E45.002; 365/151; 365/232
(58) Field of Classification Search .......... 257/43, 257/246, 296, 4, E27.004, E45.002; 365/232, 365/151
See application file for complete search history.

(56) References Cited

U.S. PATENT DOCUMENTS

| | | | |
|---|---|---|---|
| 6,129,901 A | 10/2000 | Moskovits et al. | |
| 6,423,583 B1 | 7/2002 | Avouris et al. | |
| 6,465,813 B2 | 10/2002 | Ihm | |
| 6,566,704 B2 | 5/2003 | Choi et al. | |
| 6,590,231 B2 | 7/2003 | Watanabe et al. | |
| 6,707,098 B2 | 3/2004 | Hofmann et al. | |
| 6,740,910 B2 | 5/2004 | Roesner et al. | |
| 6,759,693 B2 | 7/2004 | Vogeli et al. | |
| 6,798,000 B2 | 9/2004 | Luyken et al. | |
| 6,803,260 B2 | 10/2004 | Shin et al. | |
| 6,809,361 B2 | 10/2004 | Honlein et al. | |
| 6,815,294 B2 | 11/2004 | Choi et al. | |
| 6,830,981 B2 | 12/2004 | Lee et al. | |
| 6,833,567 B2 | 12/2004 | Choi et al. | |
| 6,852,582 B2 | 2/2005 | Wei et al. | |
| 6,855,603 B2 | 2/2005 | Choi et al. | |
| 6,866,891 B2 | 3/2005 | Liebau et al. | |
| 6,891,227 B2 | 5/2005 | Appenzeller et al. | |
| 6,927,982 B2 | 8/2005 | Mergenthaler | |
| 6,995,416 B2 | 2/2006 | Reisinger et al. | |
| 6,998,634 B2 | 2/2006 | Cheong et al. | |
| 2002/0153160 A1 | 10/2002 | Hofmann et al. | |
| 2002/0173089 A1 | 11/2002 | Zhu | |
| 2003/0148562 A1 | 8/2003 | Luyken et al. | |
| 2003/0155591 A1 | 9/2003 | Kreupl | |
| 2003/0178601 A1 | 9/2003 | Appenzeller et al. | |
| 2003/0179559 A1 | 9/2003 | Engelhardt et al. | |
| 2004/0004235 A1 | 1/2004 | Lee et al. | |
| 2004/0224490 A1 | 11/2004 | Wei et al. | |
| 2004/0232426 A1 | 11/2004 | Graham et al. | |
| 2004/0233649 A1 | 11/2004 | Honlein et al. | |
| 2004/0253741 A1 | 12/2004 | Star et al. | |
| 2005/0012163 A1 | 1/2005 | Wei et al. | |
| 2005/0029654 A1 | 2/2005 | Mio et al. | |
| 2005/0051805 A1 | 3/2005 | Kim et al. | |

(Continued)

*Primary Examiner* — Thomas L Dickey
(74) *Attorney, Agent, or Firm* — Aka Chan LLP

(57) ABSTRACT

A vertical device geometry for a carbon-nanotube-based field effect transistor has one or multiple carbon nanotubes formed in a trench.

31 Claims, 19 Drawing Sheets

U.S. PATENT DOCUMENTS

| | | |
|---|---|---|
| 2005/0056826 A1 | 3/2005 | Appenzeller et al. |
| 2005/0059176 A1 | 3/2005 | Rueckes et al. |
| 2005/0095780 A1 | 5/2005 | Gutsche et al. |
| 2005/0145838 A1 | 7/2005 | Furukawa et al. |
| 2005/0156203 A1 | 7/2005 | Bae et al. |
| 2005/0224888 A1* | 10/2005 | Graham et al. ............... 257/368 |
| 2007/0012961 A1 | 1/2007 | Bae et al. |
| 2007/0048908 A1 | 3/2007 | Appenzeller et al. |
| 2008/0315302 A1* | 12/2008 | Farrow et al. ................ 257/334 |

* cited by examiner

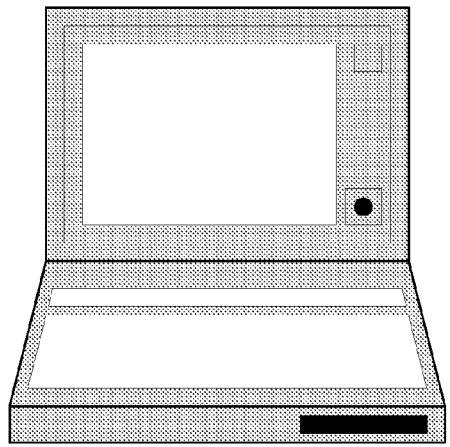
Portable Computer
Figure 1
Figure 2
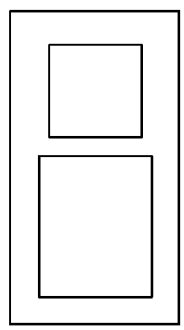
Mobile Phone
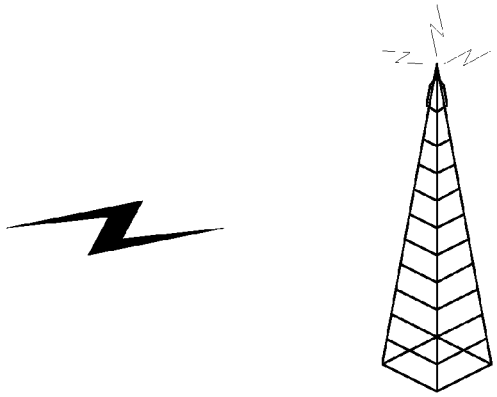
Mobile Phone Network
Base Station
Figure 3

EDGE-CONTACTED VERTICAL CARBON NANOTUBE TRANSISTOR

CROSS-REFERENCE TO RELATED APPLICATIONS

This application claims the benefit of 61/018,426, filed Dec. 31, 2007, which is incorporated by reference along with all other references cited in this application.

BACKGROUND OF THE INVENTION

The present invention relates to semiconductor devices and their manufacture, and more specifically to carbon nanotube transistor technology.

The age of information and electronic commerce has been made possible by the development of transistors and electronic circuits, and their miniaturization through integrated circuit technology. Integrated circuits are sometimes referred to as "chips." Many numbers of transistors are used to build electronic circuits and integrated circuits. Modern microprocessor integrated circuits have over 50 million transistors and will have over 1 billion transistors in the future.

Some type of circuits include digital signal processors (DSPs), amplifiers, dynamic random access memories (DRAMs), static random access memories (SRAMs), erasable programmable read only memories (EPROMs), electrically erasable programmable read only memories (EEPROMs), Flash memories, microprocessors, application specific integrated circuits (ASICs), and programmable logic. Other circuits include amplifiers, operational amplifiers, transceivers, power amplifiers, analog switches and multiplexers, oscillators, clocks, filters, power supply and battery management, thermal management, voltage references, comparators, and sensors.

Electronic circuits have been widely adopted and are used in many products in the areas of computers and other programmed machines, consumer electronics, telecommunications and networking equipment, wireless networking and communications, industrial automation, and medical instruments, just to name a few. Electronic circuits and integrated circuits are the foundation of computers, the Internet, voice over IP (VoIP), video on demand (VOD), and on-line technologies including the World Wide Web (WWW).

There is a continuing demand for electronic products that are easier to use, more accessible to greater numbers of users, provide more features, and generally address the needs of consumers and customers. Integrated circuit technology continues to advance rapidly. With new advances in technology, more of these needs are addressed. Furthermore, new advances may also bring about fundamental changes in technology that profoundly impact and greatly enhance the products of the future.

The building blocks in electronics are electrical and electronic elements. These elements include transistors, diodes, resistors, and capacitors. There are many numbers of these elements on a single integrated circuit. Improvements in these elements and the development of new and improved elements will enhance the performance, functionality, and size of the integrated circuit.

An important building block in electronics is the transistor. In fact, the operation of almost every integrated circuit depends on transistors. Transistors are used in the implementation of many circuits. Improving the characteristics and techniques of making transistors will lead to major improvements in electronic and integrated circuit.

Presently silicon-based metal-oxide-semiconductor field-effect transistors (MOSFETs) are the workhorses of electronic systems and power electronics systems. However, demand for increasing performance requirements is pushing the boundaries of silicon material. It is desirable to have transistors with improved characteristics, especially transistors having higher current density, higher thermal conductivity, and higher switching frequency.

Therefore, there is a need to provide improved transistor technology.

BRIEF SUMMARY OF THE INVENTION

This invention provides a vertical device geometry for a carbon-nanotube-based field effect transistor (CNTFET). In one embodiment of the invention the source and drain electrodes are incorporated in a vertically layered film stack separated by insulating films and patterned with a trench (or hole) to expose the source and drain film edges. A catalyst layer in the bottom of the trench serves to nucleate carbon nanotube (CNT) growth up along the sidewalls of the trench so that one or more nanotubes contacts the exposed edges of both the S and D electrodes. A thin gate insulator is deposited over the carbon nanotube, followed by deposition and patterning of a top gate electrode. This vertical configuration (normal to substrate) enables CNTFETs to be densely packed to maximize power density for power transistor applications. Furthermore, the geometry allows the source and drain electrodes to be closely spaced without expensive high resolution lithography, so that carbon nanotube transistor performance can be greatly improved.

The device geometry can utilize linear trenches or circular or oval hole arrays, or combinations of these, to provide high densities of near-vertical carbon nanotubes in an electrically parallel array. With the invention, one can fabricate large numbers of carbon nanotubes in a much smaller area than is possible with the conventional horizontal geometry (in plane to substrate). This leads to significant improvements in power density as well as a reduction in device size for a given power. The layered vertical device structure also provides a simple and inexpensive means for obtaining closely spaced source and drain electrodes without resorting to expensive high resolution lithography. Because electronic transport is ballistic in the nanotubes, a CNTFET will have much lower on-resistance than equivalent silicon devices (estimated to be a 20 times improvement). Furthermore, the extremely high thermal conductivity of the carbon nanotubes provides a highly efficient thermal sink for removing heat dissipated in the devices. Finally the nanotubes are mechanically robust with a far greater tensile strength than silicon or any known material.

In an implementation, a method includes: providing a substrate; forming a first electrode layer above the substrate; forming a second electrode layer above the first electrode layer; forming a first insulator layer between the first and second electrode layers; forming a trench extending into the first electrode, second electrode, and first insulator layers; and forming a first carbon nanotube extending from the first to the second electrode, where the first carbon nanotube electrically contacts the first and second electrodes.

The method includes: forming a gate insulator in the trench on the first carbon nanotube; and forming on the gate insulator a gate electrode. The method includes: forming a second insulator layer between the drain electrode layer and the substrate. Between the drain electrode layer and the substrate may be a catalyst layer.

Before forming a first carbon nanotube, a catalyst may be deposited at a bottom of the trench. The method includes forming a side gate electrode layer between the source and drain electrode layers. The method includes forming a top gate insulator in the trench on the carbon nanotube; and forming on the top gate insulator a top gate electrode.

The first carbon nanotube is positioned to contact the first and second electrode layers on a first side of the trench and the method further includes: forming a second carbon nanotube extending from the first to the second electrode on a second side of the trench, where the first carbon nanotube electrically contacts the first and second electrodes on the second side.

Further, in another implementation, the first carbon nanotube is positioned to contact the first and second electrode layers on a first side of the trench and the method further includes: forming a second carbon nanotube extending from the first to the second electrode on the first side of the trench, where the first carbon nanotube electrically contacts the first and second electrodes on the first side. The method includes forming a third carbon nanotube extending from the first to the second electrode on a second side of the trench, where the third carbon nanotube electrically contacts the first and second electrodes on the second side.

The method includes: forming a gate insulator in the trench on the first and second carbon nanotubes; and forming on the gate insulator a first gate electrode for the first and second carbon nanotubes. The gate electrode covers the first and second carbon nanotubes and runs continuously from the first side to the second side of the trench. In a specific implementation, a slope of a first side of the trench, relative to a surface of the substrate, is from about 38 degrees to about 60 degrees.

The method includes forming a second gate electrode layer between the source and drain electrode layers. The method includes forming a third electrode layer above the second electrode layer, where the third electrode layer is electrically connected to the first carbon nanotube.

In an implementation, a device includes a trench including a first sidewall and a second sidewall. The first sidewall includes a first electrode layer; a second electrode layer, above the first electrode layer; and a first insulating separating the first and second layers. The second sidewall includes a third electrode layer; a fourth electrode layer, above the third electrode layer; and a second insulating separating the third and fourth layers.

The device further includes: a first nanotube in the trench, connected to the first and second electrode layers; a second nanotube in the trench, connected to the third and fourth electrode layers; a gate insulator layer covering the first and second nanotubes; and a gate electrode layer covering the gate insulator layer and the first and second nanotubes.

In a specific implementation, a slope of the first sidewall of the trench, relative to a surface of a substrate on which the device is formed, may be from about 38 degrees to about 60 degrees. In another implementation, a slope of the first sidewall of the trench, relative to a surface of a substrate on which the device is formed, is from about 80 degrees to about 90 degrees.

The first and second nanotubes are single-walled carbon nanotubes. A width of the trench is at least about 500 angstroms. A depth of the trench is at least about 0.2 microns.

The gate electrode layer has a first slope for covering the first sidewall, a second slope for covering the second sidewall, and a third slope for covering a bottom of the trench. The third slope is different from the first and second slope. The third slope may be substantially perpendicular to the first slope.

The first sidewall may further include a first side gate electrode layer between the first and second electrode layers. The second sidewall may further include a second side gate electrode layer between the third and fourth electrode layers. Between the first side gate electrode layer and the first nanotube is a first side gate insulator and between the second side gate electrode layer and the second nanotube is a second side gate insulator.

In an implementation, a device includes: a first electrode; a second electrode; a first gate electrode, between the first and second electrodes and separated from the first electrode by a first insulator and separated from the second electrode layer by a second insulator; and a nanotube, connected to and extending from the first and second electrodes, where the nanotube is separated from the first gate electrode by a first gate insulator. The nanotube may be a single-walled carbon nanotube.

The device includes: a second gate insulator covering the nanotube and extending from the first to the second electrodes; and a second gate electrode covering the second gate insulator and nanotube, and extending from the first to the second electrodes.

In a specific implementation, the first gate electrode and second electrodes are above the first electrode, and the nanotube is oriented approximately perpendicular to a substrate on which the device is formed. The first, second, and first gate electrodes can be along a sidewall of a trench.

An electronic system may include one or more device (or a device manufactured using a process) as discussed in this application. This electronic system may be, for example, network router, server, a desktop computer, portable computer or laptop, automobile, mobile phone, mobile phone based station, integrated circuit, battery charger circuitry, or power conversion circuitry, and many other systems.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIG. 1 shows a computing system incorporating the invention.

FIG. 2 shows a motor vehicle system incorporating the invention.

FIG. 3 shows a telecommunications system incorporating the invention.

DETAILED DESCRIPTION OF THE INVENTION

Figure 4:
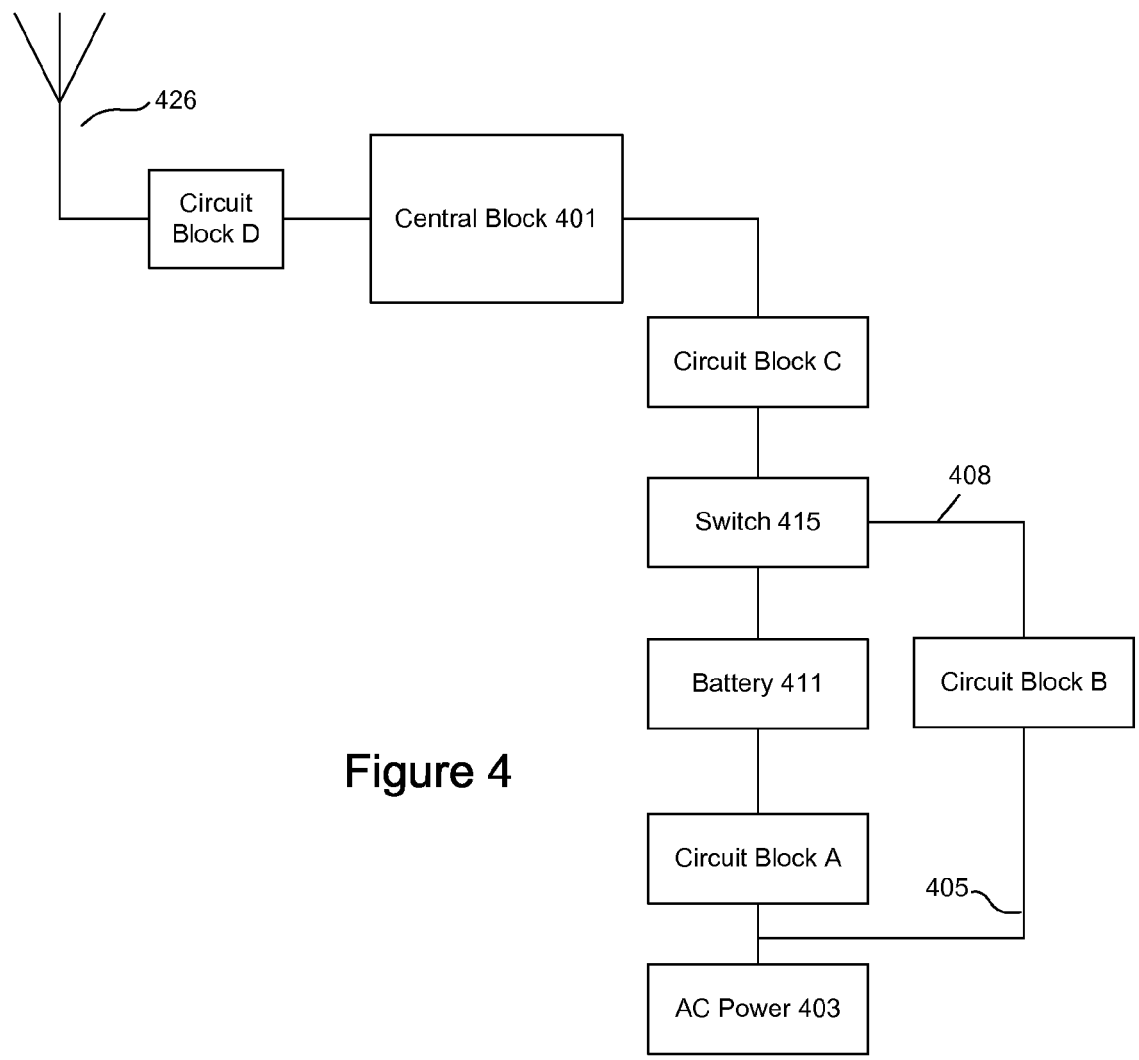
FIG. 4 shows a block diagram of a system incorporating the invention.

The invention provides a carbon nanotube device and techniques for manufacturing such a device, especially a transistor device. In a specific embodiment, the carbon nanotube device is a single-walled carbon nanotube (SWNT) transistor, where the single-walled carbon nanotube is an element of the transistor. A specific application of a single-wall carbon nanotube device of the invention is as a power transistor, a type of transistor capable of passing relatively high currents compared to standard transistors. Carbon nanotube transistors of the invention may be fabricated independently or in combination with devices and with devices of different technologies.

FIG. 1 shows an example of an electronic system incorporating one or more carbon nanotube transistors or rectifying devices of the invention, or combinations of these. Electronic systems come in many different configurations and sizes. Some electronic systems are portable or handheld. Such portable systems typically may be battery operated.

The battery is typically a rechargeable type, such as having nickel cadmium (NiCd), nickel metal hydride (NiMH), lithium ion (Li-Ion), lithium polymer, lead acid, or another rechargeable battery chemistry. The system can operate for a certain amount of time on a single battery charge. After the battery is drained, it may be recharged and then used again.

In a specific embodiment, the electronic system is a portable computing system or computer, such as a laptop or notebook computer. A typical computing system includes a screen, enclosure, and keyboard. There may be a pointing device, touchpad, or mouse equivalent device having one or more buttons. The enclosure houses familiar computer components, some of which are not shown, such as a processor, memory, mass storage devices, battery, wireless transceiver, and the like. Mass storage devices may include mass disk drives, floppy disks, magnetic disks, fixed disks, hard disks, CD-ROM and CD-RW drives, DVD-ROM and DVD-RW drive, Flash and other nonvolatile solid-state storage drives, tape storage, reader, and other similar devices, and combinations of these.

Other examples of portable electronics and battery-operated systems include electronic game machines (e.g., Sony PlayStation Portable), DVD players, personal digital assistants (PDAs), remote controls, mobile phones, remote controlled robots and toys, power tools, still and movie cameras, medical devices, radios and wireless transceivers, and many others. The transistor of the invention may be used in any of these and other electronic and battery-operated systems to provide similar benefits.

Transistors or rectifying devices of the invention, or combinations of these, may be used in various circuits of electronic systems including circuitry for the rapid recharging of the battery cells and voltage conversion, including DC-DC conversion. For example, each laptop power supply typically has eight power transistors. Transistors of the invention may be used in circuitry for driving the screen of the system. The screen may be a flat panel display such as a liquid crystal display (LCD), plasma display, or organic light emitting diode (OLED) display. Transistors of the invention may be used in circuitry for the wireless operation of the system such as circuitry for wireless networking (e.g., Wi-Fi, 802.11a, 802.11b, 802.11 g, or 802.11n) or other wireless connectivity (e.g., Bluetooth or WiMAX).

FIG. 2 shows an example of a vehicle incorporating one or more carbon nanotube transistors or rectifying devices of the invention, or combinations of these. Although the figure shows a car example, the vehicle may be a car, automobile, truck, bus, motorized bicycle, scooter, golf cart, train, plane, boat, ship, submarine, wheelchairs, personal transportations devices (e.g., Segway Human Transporter (HT)), or other. In a specific embodiment, the vehicle is an electric vehicle or hybrid-electric vehicle, whose motion or operation is provided, at least in part, by electric motors.

In an electric vehicle, rechargeable batteries, typically lead acid, drive the electric motors. These electric or hybrid-electric vehicles include transistors or devices of the invention in, among other places, the recharging circuitry used to recharge the batteries. For a hybrid-electric vehicle, the battery is recharged by the motion of the vehicle. For a fully electric vehicle, the battery is charged via an external source, such as an AC line or another connection to a power grid or electrical power generator source. The vehicular systems may also include circuitry with transistors of the invention to operate their on-board electronics and electrical systems.

FIG. 3 shows an example of a telecommunications system incorporating one or more carbon nanotube transistors or rectifying devices of the invention, or combinations of these. The telecommunications system has one or more mobile phones and one or more mobile phone network base stations. As described above for portable electronic devices, each mobile phone typically has a rechargeable battery that may be charged using circuitry with transistors or devices of the invention. Furthermore, for the mobile phone or other wireless device, there may be transceiver or wireless broadcasting circuitry implemented using transistors of the invention. And a mobile phone network base station may have transceiver or broadcasting circuitry with transistors or devices of the invention.

FIG. 4 shows a more detailed block diagram of a representative system incorporating the invention. This is an exemplary system representative of an electronic device, notebook computer, vehicle, telecommunications network, or other system incorporating the invention as discussed above. The system has a central block 401, a component of the system receiving power. The central block may be a central processing unit, microprocessor, memory, amplifier, electric motor, display, or other.

DC power is supplied to the central block from a rechargeable battery 411. This battery is charged from an AC power source 403 using a circuit block A including carbon nanotube transistors or devices of the invention. Circuit block A may include circuitry to convert AC power to DC power, and this circuitry may also include carbon nanotube transistors or rectifying devices. Although a single circuit block A is shown to simplify the diagram, the circuitry may be divided into two circuit blocks, one block for AC-to-DC conversion and another block for the recharging circuitry.

Central block may be a device that can be powered either by the AC line or from the battery. In such an embodiment, there would be a path from AC power, connection 405, circuit block B, and connection 408 to a switch 415. The battery is also connected to switch 415. The switch selects whether power is supplied to the central block from the battery or from the AC power line (via circuit block B). Circuit block B may include AC-to-DC conversion circuitry implemented using carbon nanotube transistors or devices of the invention. Furthermore, in an implementation of the invention, switch 415 includes carbon nanotube transistors or devices of the invention.

Circuit block B may be incorporated into a power supply for central block. This power supply may be switching or linear power supply. With carbon nanotube transistors of the invention, the power supply will be able to provide more power in a more compact form factor than using typical transistors. The power supply of the invention would also generate less heat, so less energy is used, and there is less likelihood of overheating or fire. Also, a fan for the power supply may not be necessary, so a system incorporating a power supply having nanotube transistors of the invention may be quieter.

The path from AC power through circuit block B is optional. This path is not needed in the case there is not an option to supply power from an AC line to the central block. In such a case, switch 415 would also not be used, and battery 411 would directly connect to circuit block C. As can be appreciated, there are many variations to how the circuitry of the system in the figure may be interconnected, and these variations would not depart from the scope of the invention.

Circuit block C is circuitry such as a DC-to-DC power converter or voltage regulator including carbon nanotube transistors or devices of the invention. This circuitry takes DC power of a certain voltage and converts it to DC voltage at a different voltage level. For example, the battery or output of circuit block B may have an output voltage of about 7.2 volts, but the central block uses 3 volts. Circuit block C converts the 7.2 volts to 3 volts. This would be a step-down converter since voltage of a higher level is being converted to a lower level.

In the case central block 401 has a wireless component, a path including circuit block D and antenna 426 will be used to transmit and receive wireless signals. Circuit block includes carbon nanotube transistors of the invention to perform the signal transmission or reception. For example, the carbon nanotube transistors may be used as output devices in an amplifier generating the wireless signal. In an implementation of the invention without a wireless component, then circuit block D and the antenna would not be present.

Figure 5:
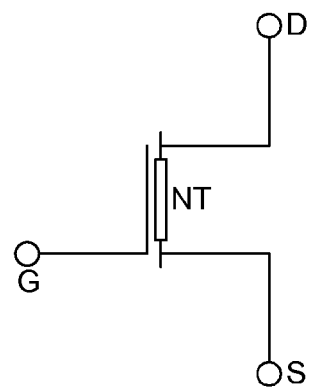
FIG. 5 shows a circuit symbol for a carbon nanotube transistor.

FIG. 5 shows a symbol of a carbon nanotube transistor of the invention. According to the invention, transistors are manufactured using carbon nanotubes (CNTs). And more specifically, field-effect transistors (FETs) are manufactured using single-walled carbon nanotubes. The transistor has a gate node G, drain node D, and source node S. This carbon nanotube transistor of the invention does not have a bulk, substrate, or well node as would a typical MOS transistor of an integrated circuit. In other embodiments of the invention, the carbon nanotube transistor may have a bulk node.

When an appropriate voltage is applied to the gate node, the charge carrier density can be increased to form a conductive channel along the carbon nanotube, denoted by NT. Current can flow from drain to source. Operation of the single-walled carbon nanotube transistor of the invention is analogous to a metal oxide semiconductor (MOS) transistor.

The single-walled carbon nanotube is a relatively recently discovered material. A single-walled carbon nanotube can be conceptually described as a single sheet of graphite (also called graphene) that is configured into a seamless cylindrical roll with diameters typically about 1 nanometer, but can range from about 0.4 to about 5 nanometers. The cylinder may be a one-layer thick layer. For example, a nanotube may be 0.5, 0.7, 0.8, 0.9, 1.0, 1.1, 1.2, 1.3, 1.6, 2, 2.5, 2.7, 3, 3.2, 3.6, 3.8, 4.0, 4.2, 4.3, 4.5, 4.6, 4.7, or 4.9 nanometers. Depending on the process technology, single-walled carbon nanotubes may have diameters less than 0.7 nanometers or greater than 5 nanometers.

In addition to single-walled carbon nanotubes, another type of carbon nanotube is a multiwalled carbon nanotube (MWNT). A multiwalled carbon nanotube is different from single-walled carbon nanotube. Instead of a single carbon nanotube cylinder, multiwalled carbon nanotubes have concentric cylinders of carbon nanotubes. Consequently, multiwalled carbon nanotubes are thicker, typically having diameters of about 5 nanometers and greater. For example, multiwalled carbon nanotubes may have diameters of 6, 7, 8, 10, 11, 15, 20, 30, 32, 36, 50, 56, 62, 74, 78, 86, 90, 96, or 100 nanometers, or even larger diameters.

Single-walled carbon nanotubes have unique electrical, thermal, and mechanical properties. Electronically they can be metallic or semiconducting based on their chirality or helicity, which is determined by their (n, m) designation, which can be thought of as how the graphite sheet is rolled into a cylinder. Typically, individual single-walled carbon nanotubes can handle currents of 20 microamps and greater without damage. Compared to multiwalled carbon nanotubes, single-walled carbon nanotubes generally have a very low density of structural defects, which is significant for electronics applications.

Single-walled carbon nanotube material has proven to have incredible materials properties. It is the strongest known material—about 150 times stronger than steel. It has the highest known thermal conductivity (about 6000 watts per meter per degree Kelvin). The properties of semiconducting single-walled carbon nanotubes are indeed promising. They may be used in field-effect transistors (FETs), nonvolatile memory, logic circuits, and other applications.

With regard to transistor applications, single-walled nanotube devices have "on" resistances and switching resistances that are significantly lower than those of silicon. Transistors based on single-walled carbon nanotube technology can handle considerably higher current loads without getting as hot as conventional silicon devices. This key advantage is based on two factors. First, the lower "on" resistance and more efficient switching results in much lower heat generation, which is equivalent to lower energy dissipation. Second, single-walled carbon nanotubes have high thermal conductivity, which ensures that the heat does not build up.

Important considerations in carbon nanotube field effect transistor (CNTFET) design and fabrication are threefold. A first consideration is the controlled and reproducible growth of high quality single-walled carbon nanotubes with the desirable diameter, length, and chirality. A second consideration is the efficient integration of nanotubes into electronic structures. And a third consideration is current nanotube growth and device fabrication processes need to be improved significantly so that they are amenable to scalable and economical manufacturing.

Figure 6:
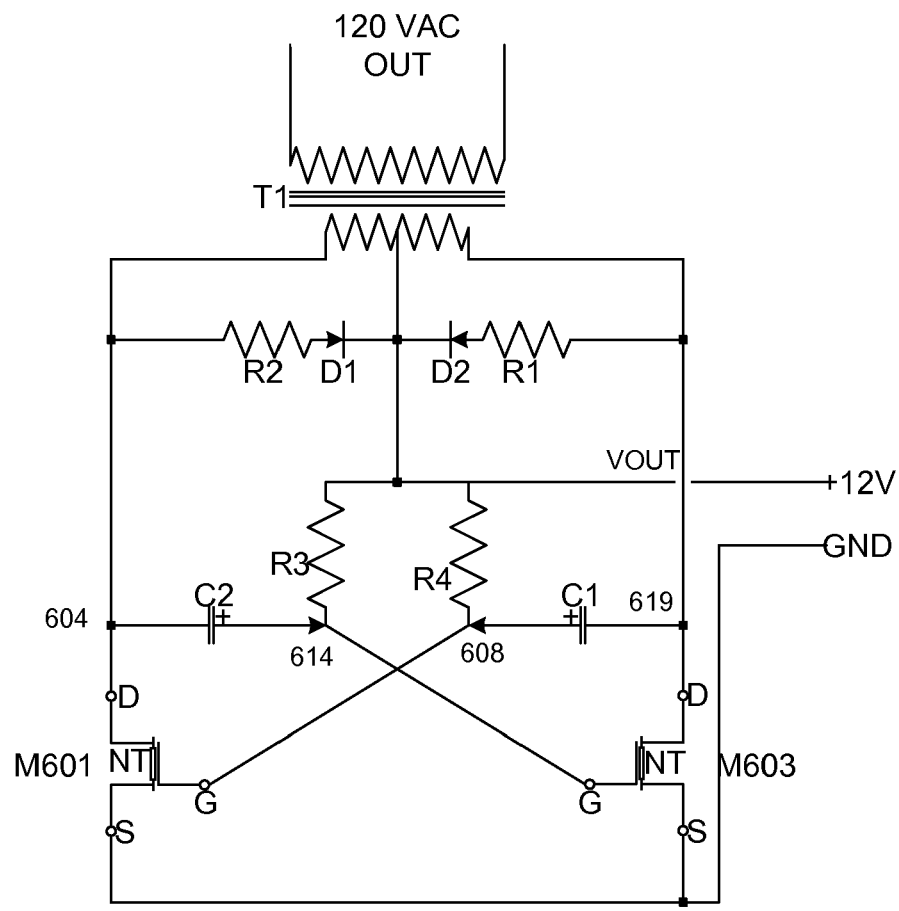
FIG. 6 shows a DC-to-AC inverter circuit using carbon nanotube transistors.

FIG. 6 shows an AC-to-DC converter circuit using two carbon nanotube transistors, M601 and M603, of the invention. The circuitry takes an AC voltage input, such as 120 volts provided at transformer T1 and provides a DC voltage output, such as the 12 volts indicated in the figure. The converter may be designed to take as input any AC voltage, but 120 volts was selected since this is the standard AC line voltage in the U.S. The circuitry may be designed to output any desired DC voltage, less than or more than 12 volts, such as 2 volts, 3, volts, 5 volts, 6 volts, 16 volts, 18 volts, or 20 volts, by varying the circuit components. For example, the resistances R1, R2, R3, and R4 may be varied.

Single-walled carbon nanotube transistor M601 is connected between a node 604 and ground. A gate node of M601 is connected to node 608. A capacitor C2 is connected between 604 and 614, which is connected to a gate of single-walled carbon nanotube transistor M603. M603 is connected between node 619 and ground. A capacitor C1 is connected between 608 and 619. Resistor R3 is connected between DC output, VOUT, and 614. Resistor R4 is connected between VOUT and 608. Between VOUT and 604 are a diode D1 and resistor R2. Between VOUT and 619 are a diode D2 and resistor R1. Nodes 604 and 619 are connected to windings of transformer T1.

The AC-to-DC converter may output significant currents because the converter provides power for circuits having relatively large power needs. Therefore, in such cases, carbon nanotube transistors M601 and M603 will pass relatively large currents. In addition, in a battery recharging battery application, by increasing the current M601 and M603 can pass without overheating or damaging the devices, this will speed-up the rate at which batteries may be recharged.

Figure 7:
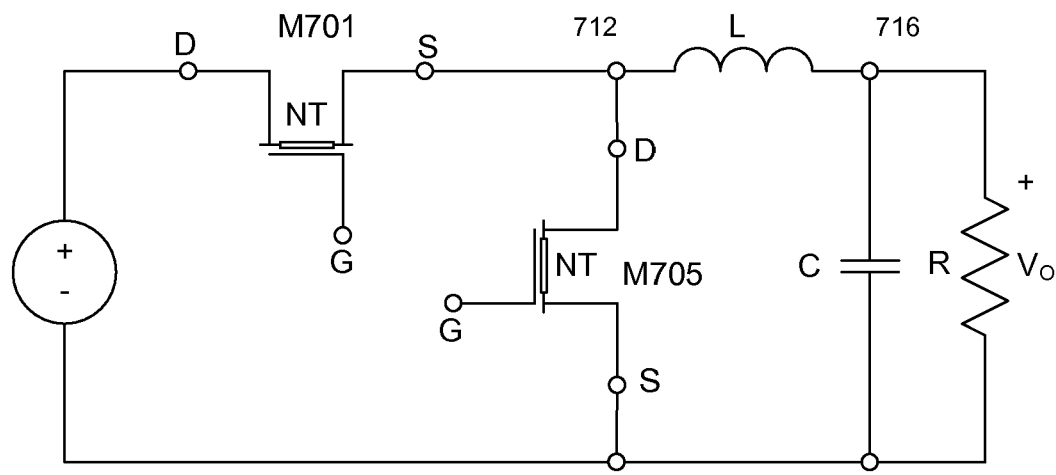
FIG. 7 shows a DC-DC converter circuit using carbon nanotube transistors.

FIG. 7 shows a DC-to-DC converter circuit using two carbon nanotube transistors, M701 and M705, of the invention. The circuit takes a DC input voltage, VIN, and outputs a different DC voltage, VO. For example, VIN may be 7.2 volts or 12 volts, and VO may be 5 volts or 3 volts. Voltage conversion is used in many applications such as portable electronics because batteries may not provide output at a desired voltage level or at a voltage compatible with electronics.

This circuit may also be part of a DC inverter circuit, in which case a voltage output of opposite polarity to the input voltage is provided. For example, if the input voltage is positive, the output voltage of the inverter would be negative. Or if the input voltage is negative, the output voltage of the inverter would be positive.

Single-walled carbon nanotube transistor M701 is connected between VIN+ and node 712. Single-walled carbon nanotube transistor M705 is connected between node 712 and VIN− (or ground). An inductor L is connected between 712 and 716. A capacitor and resistor are connected between 716 and VIN−. An output VO is taken between node 716 and ground.

In a further embodiment of the invention, there may be a first diode connected between a drain and source of transistor M701, and a second diode connected between a drain and source of transistor M705. The first diode may be connected so that current will be allowed to flow in a direction from node 712 to VIN+. The second diode may be connected so that current will be allowed to flow in a direction from ground to node 712.

These diodes may be designed or fabricated using any technique used to obtain devices with diode characteristics including using a diode-connected transistor, where a gate and drain of the transistor are connected together, or other transistor techniques. In another embodiment, a diode may be integrated with a nanotube transistor using a single-walled carbon nanotube and nanowire junction or other junction as is discussed in U.S. patent application Ser. No. 11/162,548, filed Sep. 14, 2005, which is incorporated by reference.

In operation, the converter circuit converts the VIN voltage to a VO or VOUT voltage. A first signal is connected to a gate of transistor M701, and a second signal is connected to a gate of transistor M705. The first and second signals may clock signals or oscillator signals including square waves, pulse trains, sawtooth signals, and the like. The first and second signals and may be generated by a controller for the converter circuit.

Power transistors are high power output stages in electronics that typically carry high currents and power. They are elements in power amplifiers and are used to deliver required amounts of current and power efficiently to a load. Applications include power delivery to devices within integrated circuits, personal computers, cellular phones, wireless base stations, and a variety of electrical devices. Power transistors are also used for high current switches and supplying power to motors.

At the present time, power transistors are bipolar junction transistors (BJT) or metal oxide semiconductor field-effect transistors (MOSFET) based on silicon technology. In addition to these silicon-based devices, other materials are used such as gallium arsenide and gallium nitride. However, silicon bipolar junction transistors and silicon metal oxide semiconductor field-effect transistors, specifically laterally diffused metal oxide semiconductor, dominate the field. The entire power transistor device contains a multitude of linked individual transistors in order to distribute the total current and power. Relevant parameters in power transistors include current carrying and power capability, current gain, efficiency, and thermal resistance.

There are a number of challenges to commercialization of carbon nanotube transistors and replacing current semiconductor technologies, including chirality control or elimination of metallic carbon nanotubes, location and orientation control, size and length control, and overall quality control of the properties of single-walled carbon nanotubes on a large scale. These are addressed by the present invention.

The invention provides a vertical device geometry for a carbon-nanotube-based field effect transistor (CNTFET). In an embodiment, the transistor has single-walled carbon nanotubes. This patent describes and provides cross sections for a transistor portion having one or multiple carbon nanotubes. In a specific implementation, a power transistor or relatively large sized transistor device including many numbers of carbon nanotubes is formed by using many numbers of the transistor portions described. The electrodes are electrically connected together in parallel or series, or otherwise shorted to each other, so that the transistor portions act as a single transistor.

Figure 8A:
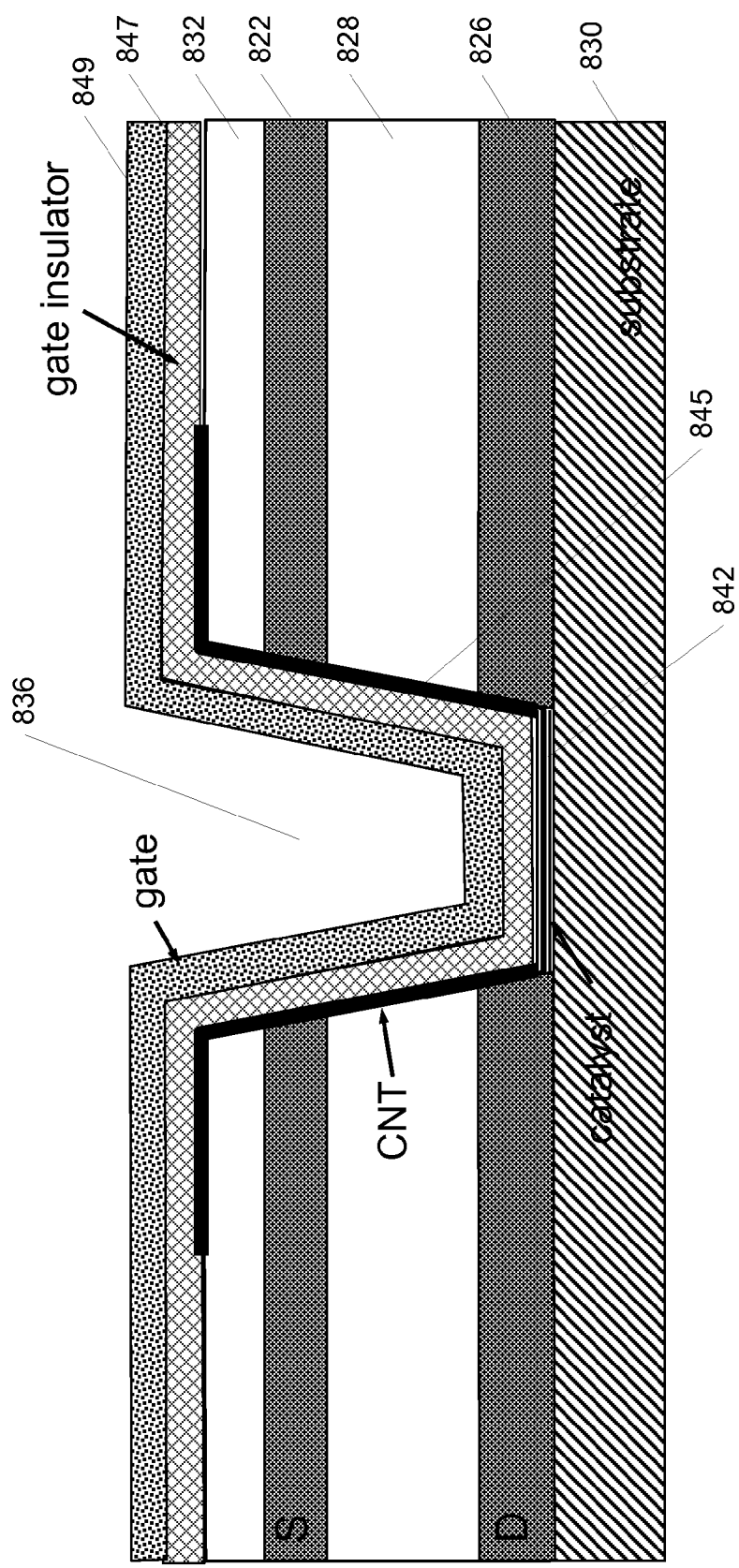
FIG. 8A shows a cross section of an implementation of a carbon nanotube transistor.

FIG. 8A shows a cross section of an implementation of an edge-contacted vertical carbon nanotube transistor. Source 822 and drain 826 electrodes are incorporated in a vertically layered film stack separated by insulating films. The layers from bottom to top include a substrate layer 830, drain electrode layer 826, insulator layer 828, source electrode layer 822, and insulator layer 832.

In the implementation of this figure, the drain electrode layer is formed directly on the substrate layer. However, in other implementations, there may be an intervening insulator layer. The source and drain layers may have thickness from about 0.1 microns to about 0.5 microns. The insulator layer separating the source and drain layer may have a thickness of from about 0.1 microns to about 1 micron.

The insulator layer separating the source and drain layer may have a nonuniform thickness. In an implantation, the insulator layer is thinner at and closer to the trench and thicker farther away. This allows production very short, high performance carbon nanotube transistors, while reducing the parasitic capacitance and ensuring good isolation in the rest of the device.

The source and drain layers may be swapped. The source and drain regions can be referred to as diffusion region or diffusion layers.

The substrate and base metal can be solid or porous. There are many suitable substrate materials. In some processes, the substrate and the drain electrode layer may be the same material or same layer, or may be different. Some substrate materials include aluminum oxide, silicon, silicon germanium, gallium nitride, germanium, gallium arsenide, plastic, polymer (e.g., polycarbonate, polystyrene, polyethylene, polypropylene, polyvinyl chloride, or polyethylene terephthalate), glass, sapphire, or quartz, or the like, or a combination of these. Further, multiple layers of carbon nanotubes transistors may be formed one on top of each other. Each layer of carbon nanotube devices is formed in similar fashion as discussed in this patent.

An electrode layer is formed on the substrate or other layer using a technique such as atomic layer deposition (ALD), sputtering, e-beam deposition, or other methods. The electrode layer can be silicon or polysilicon. The layer may also be a material such as gold (Au), titanium (Ti), palladium (Pd), platinum (Pt), aluminum (Al), or other metal.

In a specific embodiment, a refractory metal is used to form the electrode layer because of the relatively high melting point of a refractory metal. Some refractory metals include tungsten (W), molybdenum (Mo), tantalum (Ta), niobium (Nb), titanium nitride (TiN), tantalum nitride (TaN), niobium nitride (NbN), chromium, vanadium, and rhenium. Any of the materials discussed above for the electrode layer can be combined with any material. For example, polysilicon can be combined with platinum for the electrode layer. Tungsten can be combined with gold. Molybdenum can be combined with palladium and silicon.

FIG. 8A shows two electrode layers, but there can be any number of electrode layers formed above the first electrode layer. For example, there can be two, three, four, five, six, or more electrodes. The nanotubes can be sectioned, so there can be separate transistors between electrodes. Or the nanotubes can be continuous, and the electrodes connected together so there are transistors connected in parallel or series.

A trench 836 (or hole, slot, or opening) is patterned to expose the source and drain film edges. A width of the trench may be from about 500 angstroms to about 4 microns. A depth of the trench may be from about 0.2 microns to about 0.5 microns, or may be 1 micron or more. The trench may be any hole, slot, or opening having any shape. The shape of the trench or opening may be, for example, cylindrical, oval, rectangular, square, cube, V-groove (see below and FIG. 9), notched, or other. In this implementation, the trench has three sides, a bottom, and two sidewalls.

Depending on the configuration, a trench can have any number of walls, one, two, or more. See FIGS. 8C-8I and discussion below for more details. For example, the trench may have be in a star configuration and have multiple walls.

A slope of the trench sidewalls may have any angle. For example, the angle may be from about 0 to about 90 degrees, about 45 degrees to about 90 degrees, from about 60 to about 90 degrees, from 75 to about 90 degrees, from about 80 to about 90 degrees. The trench may have straight sidewalls that approximately perpendicular or about 90 degrees (e.g., 80 to 90 degrees, 85 to 90 degrees, or 88 to 90 degrees) relative to a horizontal surface of the substrate structure. In specific implementations, the angle may be greater than 90 degrees. Further, the sidewalls may or may not be completely smooth or straight.

A catalyst layer 842 is placed at a bottom of the trench and serves to nucleate carbon nanotube growth up along the sidewalls of the trench. In an implementation, before forming a nanotube, a catalyst stack is deposited onto the drain or substrate, or both, where the catalyst stack is: (a) the catalyst alone; (b) catalyst on top of a diffusion barrier where the diffusion barrier covers only the drain; or (c) catalyst on top of a diffusion barrier where the diffusion barrier covers only the drain and other regions of the trench. In an alternative implementation, instead of at the bottom of the trench, the catalyst is placed at a top, side, or another portion of the trench.

In an implementation, before forming a carbon nanotube, catalyst is deposited on any or all exposed surfaces excluding the insulating layer between the lower and upper electrodes.

The catalyst may be formed by a technique such as atomic layer deposition, sputtering, e-beam deposition, or other methods. In an embodiment, the catalyst is a continuous layer that is formed deposited below the drain. One or more carbon nanotubes are grown to contact the exposed edges of both the source and drain electrodes.

The catalyst may be thin film or nanoparticles. In some processes, the catalyst layer is optional and is not present. The catalyst used in forming carbon nanotubes 845 may include iron, nickel, or cobalt, or any combination of these metals, or any combination of one or more of these with other metals. Typically the catalyst is in the form of nanoparticles that is the appropriate size, usually 1 nanometer to 4 nanometers in diameter. In other implementations, the catalyst may be larger than 4 nanometers. These nanoparticles may be obtained through metal deposition such as by metal evaporators, electrochemical deposition of metals, or a wet deposition of catalyst where the metal catalyst nanoparticle or particles may be supported by a larger inorganic support or an organic shell, such as a ferritin protein.

The nanotubes can be grown on the catalyst. Alternatively or in addition, nanotubes suspended in a solution are deposited onto the device structure by methods such as drop casting, spin coating, or electrophoretic deposition, or combinations of these. The carbon nanotubes can be aligned via forces such as electrophoretic or fluidic alignment, or combinations of these. The carbon nanotubes can are aligned during growth through methods such as electric field alignment or edge directed growth.

In an implementation, electrical contacts to the nanotubes are formed or improved upon by deposition of palladium or another metal at the source and drain electrodes. This deposition can be performed by methods such as electrodeposition, evaporation, sputtering, atomic layer deposition, or CVD, or combinations of these.

A length of the carbon nanotube extends from the drain electrode layer to at least the source electrode layer. The drain and source electrodes contact a nanotube at two different contact points. In a specific implementation, a distance between the source and drain electrodes is from about 0.1 microns to about 1 micron. This distance may exceed 1 micron.

To enable high quality source and drain electrode contacts to the nanotubes, a thin layer of palladium or other material (not shown) can be electrodeposited on the exposed electrodes. As discussed, a drain electrode on one side of the trench may be electrically connected to a drain electrode on the other side of the trench. Similarly, a source electrode on one side of the trench may be electrically connected to the source electrode on the other side of the trench.

In an implementation, the active elements are single-walled semiconducting carbon nanotubes. Other semiconduting nanomaterials may also be used instead or in combination. Some examples of such nanomaterials include graphene, double-walled carbon nanotubes, multiwalled carbon nanotubes, and other nanowires such as boron- and carbon-based nanotubes. U.S. patent application Ser. No. 11/462,497 discusses heterostructure nanotubes devices (including nanowires) and such techniques are applicable to the structures in this application and is incorporated by reference.

A thin gate insulator or gate oxide 847 (e.g., silicon oxide) is deposited over the carbon nanotube, followed by deposition and patterning of a top gate electrode 849. The gate insulator is formed on the top, bottom, and sidewalls in the trench on the carbon nanotube. In various implementations, the gate oxide thickness may be in a range from about 2 nanometers to about 100 nanometers. The gate oxide thickness may be from about 10 nanometers to about 100 nanometers.

The gate electrode is formed over the gate insulator. This gate electrode is for the first and second carbon nanotubes, and is a continuous run over both nanotubes. The gate electrode may be formed by a technique such as atomic layer deposition, sputtering, e-beam deposition, or other methods. The gate electrode may be made using a metal (e.g., aluminum), polysilicon, polysilicide, or another conductive material. In another implementation, the gate electrode can be split in two (or electrically disconnected) so the each nanotube has its own gate.

In a further implementation (e.g., FIGS. 10 and 11), a gate electrode layer may be embedded between adjacent insulator layers, these layers being between the source and drain electrode layers. A gate insulator is also formed on the embedded or side gate electrode. See below for additional discussion.

Figure 8B:
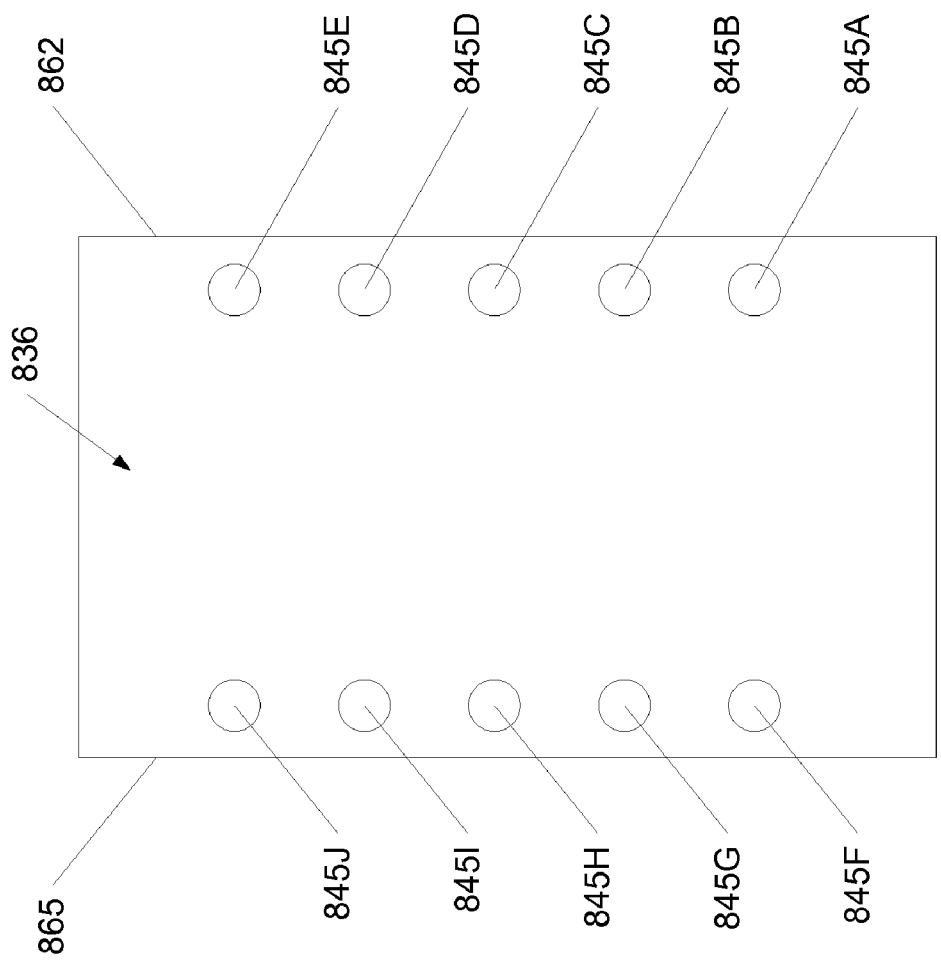
FIG. 8B shows a top view of a trench of a carbon nanotube transistor.

FIG. 8B shows a top view of portion of trench 836. The trench may run in the horizontal direction across a surface of a substrate on which the transistors are being formed. The trench can be run in any shape, polygon, or configuration for any desired length. The trench may be run as fingers, serpentine chain, spiral, or other configurations.

Carbon nanotubes are formed along the sidewalls or edges of the length of the trench run. For example, in trench 836, nanotubes 845A-845E are formed (in parallel) along a first sidewall 862. Nanotubes 845F-845J are formed (in parallel) along a second sidewall 865 of the trench. There may from about 5 nanotubes per micron to about 10 nanotubes per micron per side of a trench.

Figure 8C:
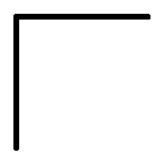
FIGS. 8C-8I show top view outlines for various different trench configuration.

FIGS. 8C-8I show top view outlines for various different trench configuration or layout (nanotubes not shown). FIG. 8C shows a trench with one turn, a 90 degree turn. The turns can be any angle such as 30, 45, 60, 75, or 90, and in any combination. There can be any number and combination of right and left turns in a trench layout.

Figure 8D:
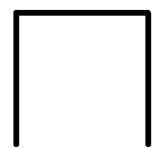
Figure 8E:
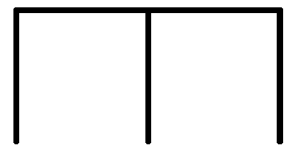
Figure 8F:
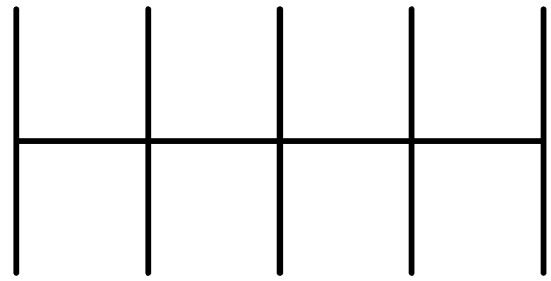

FIG. 8D shows a trench outline with two turns, which form a backward C shape. FIG. 8E shows a central spine with three arms extending from that spine, which form a backward E shape. FIG. 8F is similar to FIG. 8E, but the arms extend in both directions away from the central spine.

Figure 8G:
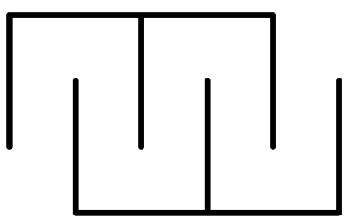
Figure 8H:
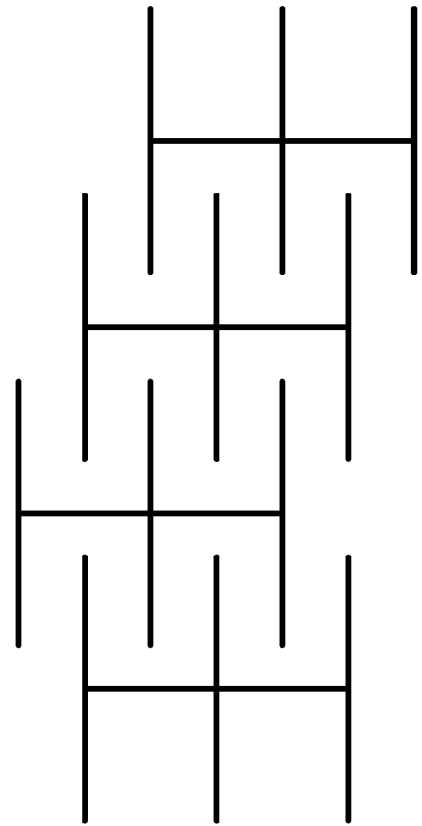

FIG. 8G shows trenches of FIG. 8E with interdigitated arms. Any number of trenches can be interdigitated together in such a fashion, which compacts the layout and more transistors can be formed for a given layout. FIG. 8H shows an example of multiple interdigitated trenches.

Figure 8I:
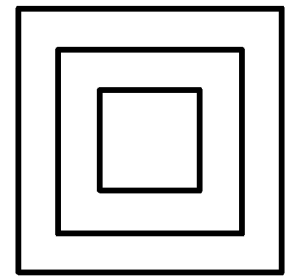

FIG. 8I shows trenches arranged in concentric square rings. For a concentric configuration, any polygon or shape (e.g., triangle, square, circle, or rectangle) may be used and there can be any number of concentric rings, two, three, four, five, six, seven, or many more. The outer ring can be one shape, while inner rings can be another shape. Further, a side of each of the rings a configuration as in FIG. 8F, which a side of each inner ring interdigitates with sides of inner and outer rings it is adjacent too.

Figure 8J:
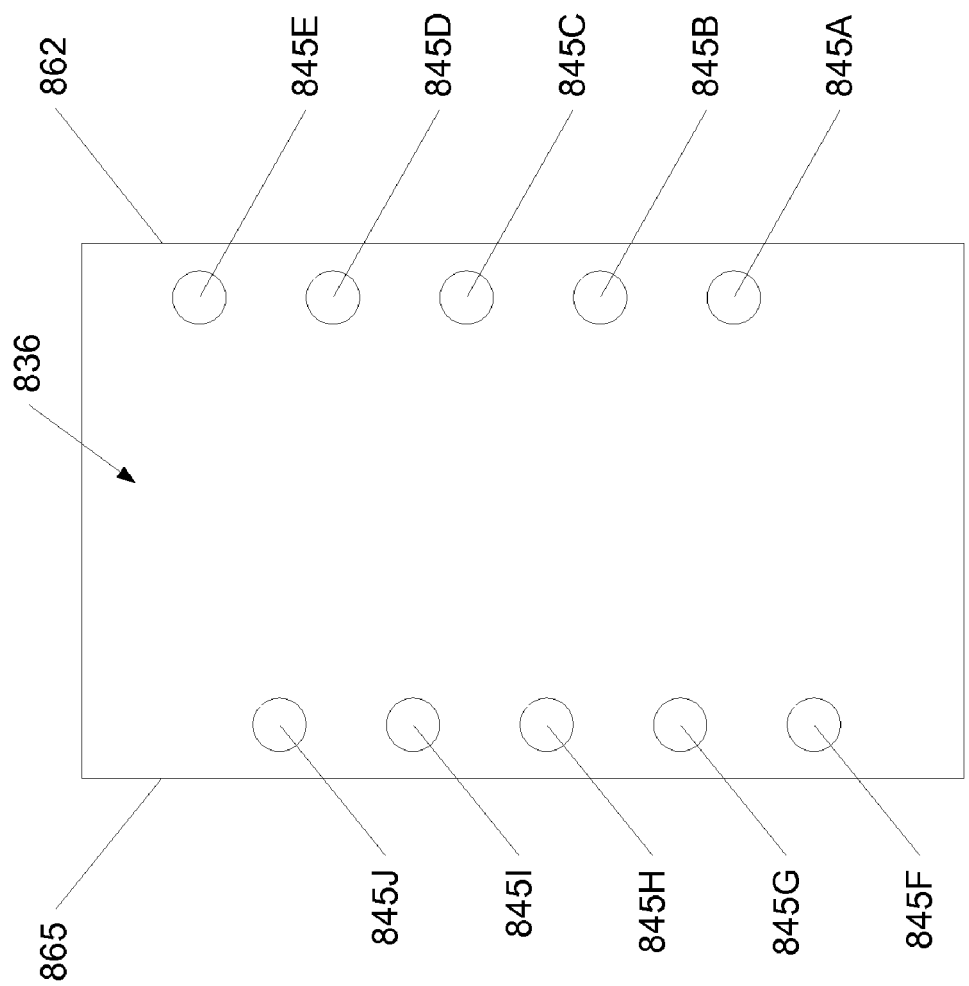
FIG. 8J shows a trench where the nanotubes on the two sides are offset from each other.

FIGS. 8A and 8B shows nanotubes in the trench directly across from each other. However, in other implementations, the carbon nanotubes are staggered or otherwise offset so that they are not directly across from each other. FIG. 8J shows an example of a trench where the nanotubes on the two opposite sides are offset from each other.

FIG. 8A shows a structure where the source and drain are electrically connected to the nanotube using edge contacts. However, these electrical contacts may be at the bottom or top, or both, the trench. For example, for a top contact, a source electrode material is deposited or formed on top of the structure and electrically connected to the nanotube. There can be a side or edge contact to a lower portion of the nanotube and a top contact to an upper portion of the nanotube.

It is also important to ensure that most or all of the nanotubes within the device are semiconducting rather than metallic (or conducting) nanotubes. This can be done using techniques to preferentially grow semiconducting carbon nanotubes, or by using a postgrowth plasma etching or other techniques to remove metallic and other undesirable nanotubes. Metallic single-walled carbon nanotubes (or other undesirable carbon nanotubes) may be reduced or removed using a technique such as plasma, electrical burn off, chemical methods, or others, or a combination of these. The undesirable carbon nanotubes may include multiwalled or metallic carbon nanotubes, or both.

Further description on the formation of single-walled carbon nanotubes and burn off (or selective removal) techniques is found in U.S. patent application Ser. No. 11/162,548. A technique of selectively removing undesirable tubes is discussed in U.S. patent application 61/091,041 is applicable to the structures discussed in this patent application. For example, a technique involves removing metallic nanotubes by gating of semiconducting nanotubes while passing large current through the metallic nanotubes, resulting in burnout of the metallic nanotubes. As discussed in U.S. patent application 61/091,041, a technique of removing metallic nanotubes involves metal-catalyzed burnout of metallic nanotubes after selective metal deposition on these nanotubes.

Figure 9:
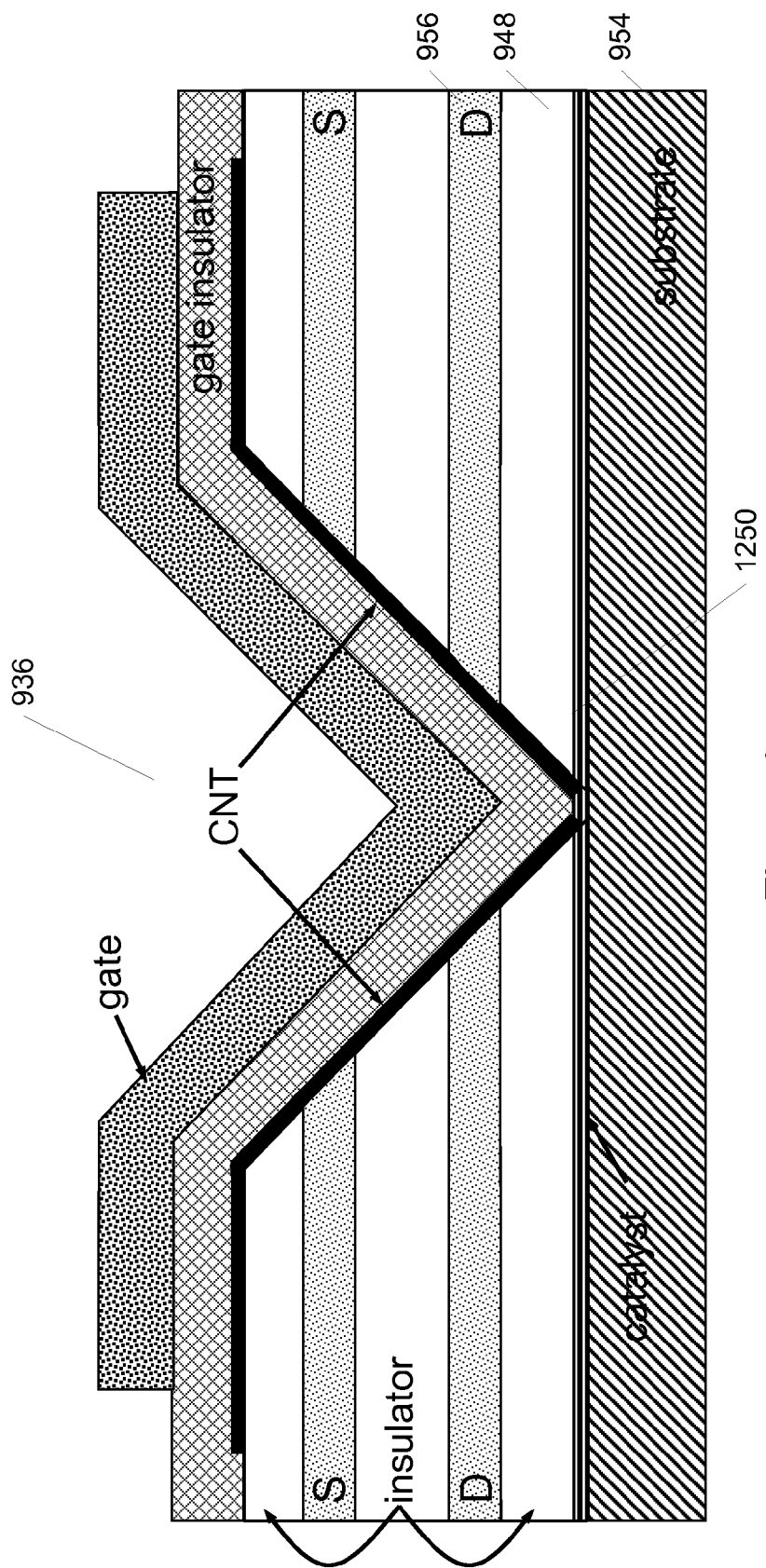
FIG. 9 shows a cross section of another implementation of a carbon nanotube transistor.

FIG. 9 shows a cross section of another implementation of an edge-contacted vertical carbon nanotube transistor. This implementation is similar to the FIG. 8A implementation, but a V-groove trench 936 is used instead of the trench of FIG. 8A. The V-groove trench has two sides with less of a slope than the three-sided trench of FIG. 8A. This cross section also shows an insulator layer 948 and continuous catalyst layer 950 between a substrate 954 and a drain layer 956.

For example, a slope of the sides of the V-groove trench may be from about 30 degrees to 75 degrees relative to a surface of the substrate. As another example, the angle can be from about 38 degrees to about 60 degrees. In various implementations, the slope is about 30 degrees, 38 degrees, 45 degrees, 50 degrees, 56 degrees, 60 degrees, 63.5 degrees, and 67 degrees.

Figure 10:
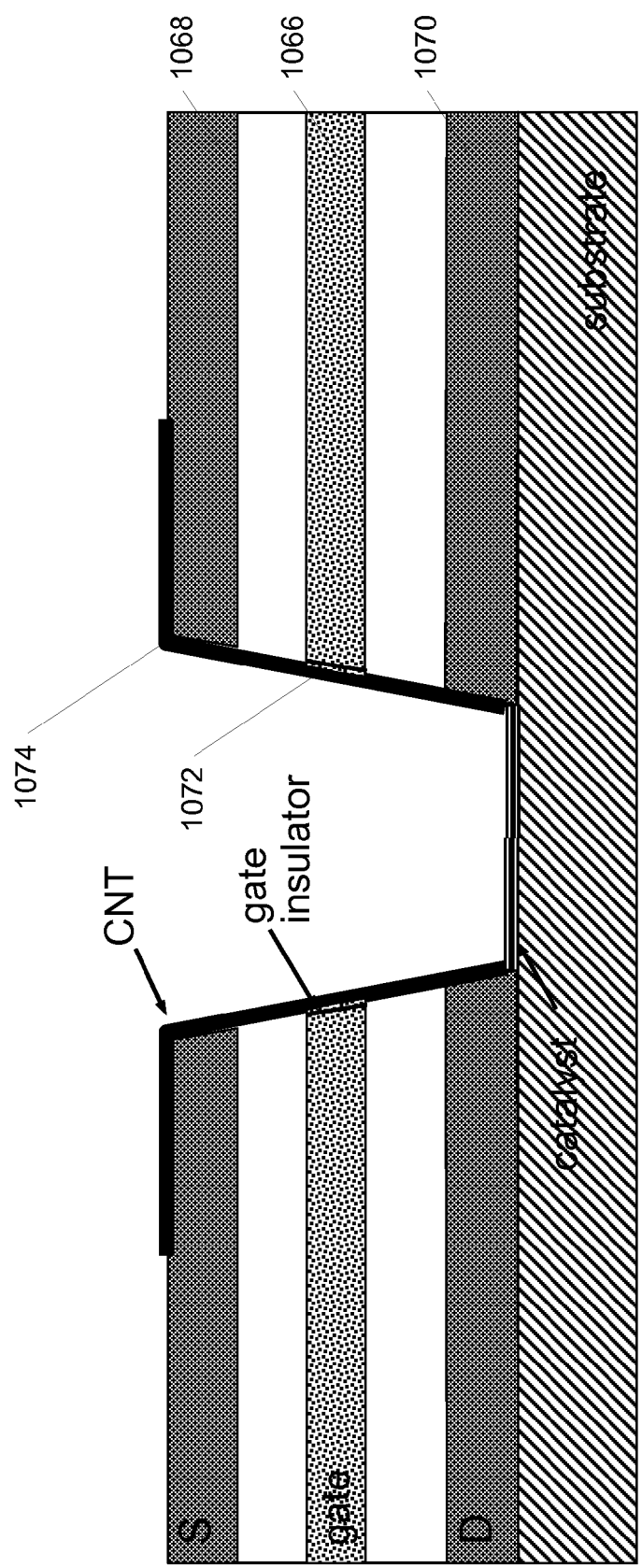
FIG. 10 shows a cross section of another implementation of a carbon nanotube transistor.

FIG. 10 shows a cross section of another implementation of an edge-contacted vertical carbon nanotube transistor. This implementation is similar to the FIG. 8A implementation, but has a gate electrode layer 1066 between source 1068 and drain 1070 layers. There is a gate insulator 1072 separating gate electrode layer 1066 from a carbon nanotube 1074.

This device geometry incorporates a semiconducting or metallic gate layer in the vertical film stack as follows: substrate, drain layer, insulator, gate layer, insulator, and source layer. The embedded side gate here enables all electrodes to be patterned before carbon nanotube growth to minimize possible nanotube processing contamination. The layered materials should be compatible with high temperature carbon nanotube growth, and a thin gate insulator should be deposited or grown on the exposed gate electrode edge. This configuration also allows one to add a second top gate structure (see below) to control the source and drain Schottky barriers as well as carrier doping within the nanotubes.

Figure 11:
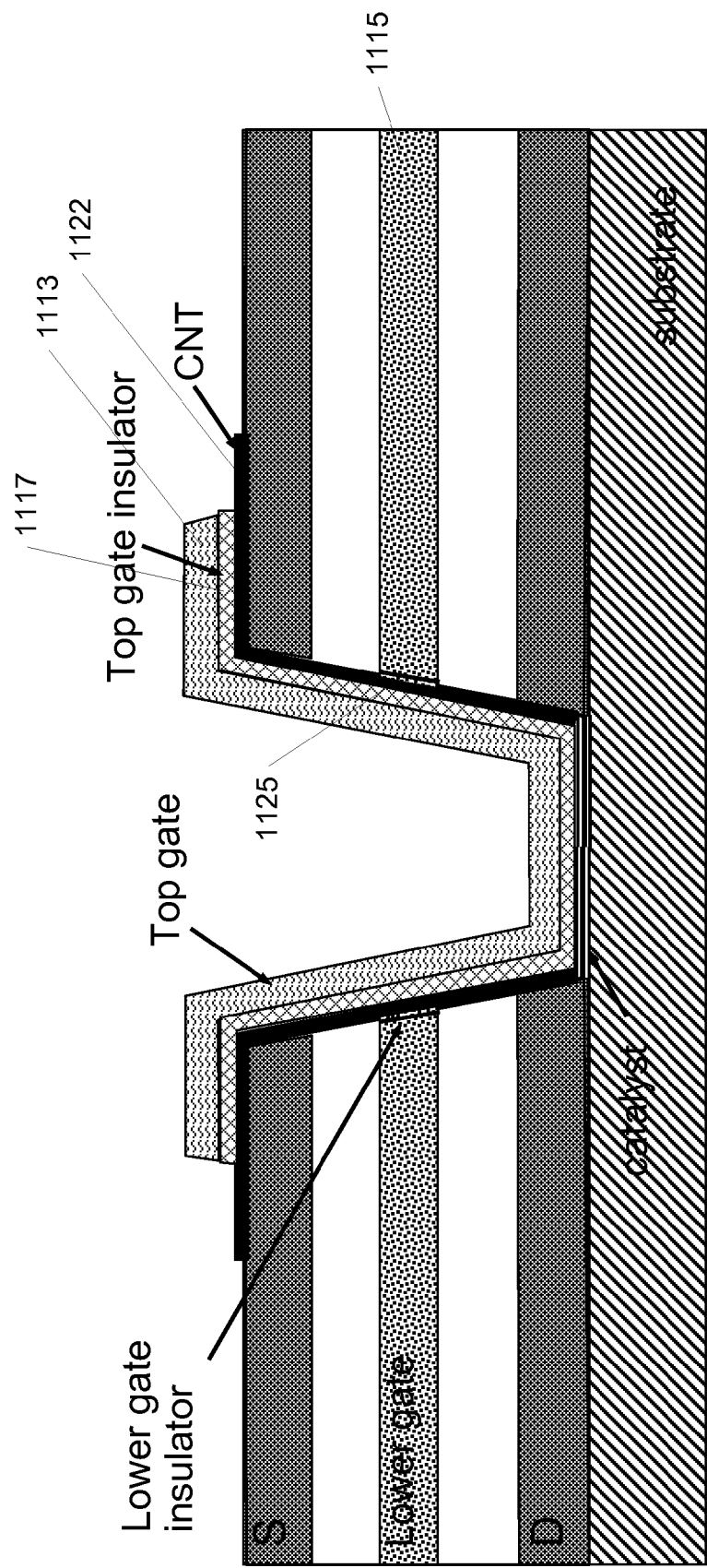
FIG. 11 shows a cross section of another implementation of a carbon nanotube transistor.

FIG. 11 shows a cross section of another implementation of an edge-contacted vertical carbon nanotube transistor. This implementation is similar to the FIG. 10 implementation, but has a top gate electrode 1113 in addition to a lower gate electrode layer 1115. There is a top gate insulator 1117 separating the top gate from a carbon nanotube 1122. There is a lower gate insulator 1125 separating the lower gate from the carbon nanotube.

FIGS. 8-11 show a single layer transistor structure, but the structures and techniques of the invention may be applied to multilayer or stacked transistor structures. One layer of structures such as shown in FIGS. 8-11 can be formed on top of each of other, with an insulating layer between the layers. U.S. patent application Ser. No. 11/761,009 discusses stacked nanotube transistors structures and is incorporated by reference.

Integrated circuits with many transistors may be formed using the structures described in this application. Nanotube transistor integrated circuits and layouts described in U.S. patent application Ser. No. 11/466,893, which is incorporated by reference, are applicable to the structures in this application.

FIGS. 12-26 show a process flow for fabrication of an edge-contacted vertical carbon nanotube transistor device. This flow is described for forming a structure as shown in FIG. 8A, but variations of this flow may also be used to form the structures in FIG. 9-11 of this application.

The fabrication processes presented are based on a standard semiconductor industry starting material: a silicon wafer, silicon dioxide, polycrystalline silicon, silicon dioxide stack (OSOS). An advantage of this process is inexpensive commercially available starting material, which is compatible with standard semiconductor fabrication lines. The use of OSOS starting wafers is not required, however, and the source and drain films could be metallic layers such as, for example, palladium. Likewise, the insulating layers could be any insulating material compatible with high temperature carbon nanotube growth conditions. Other possible variations in the process include deposition or patterning of the catalyst (e.g., iron deposited in the bottom of the trench via lift off or electrodeposition), and control of the trench sidewall profile, among other parameters.

This patent describes some specific flows for fabricating a carbon nanotube transistor, but it should be understood that the invention is not limited to the specific flows and steps presented. A flow of the invention may have additional steps (not necessarily described in this application), different steps which replace some of the steps presented, fewer steps or a subset of the steps presented, or steps in a different order than presented, or any combination of these. Further, the steps in other implementations of the invention may not be exactly the same as the steps presented and may be modified or altered as appropriate for a particular application or based on the data.

Figure 12:
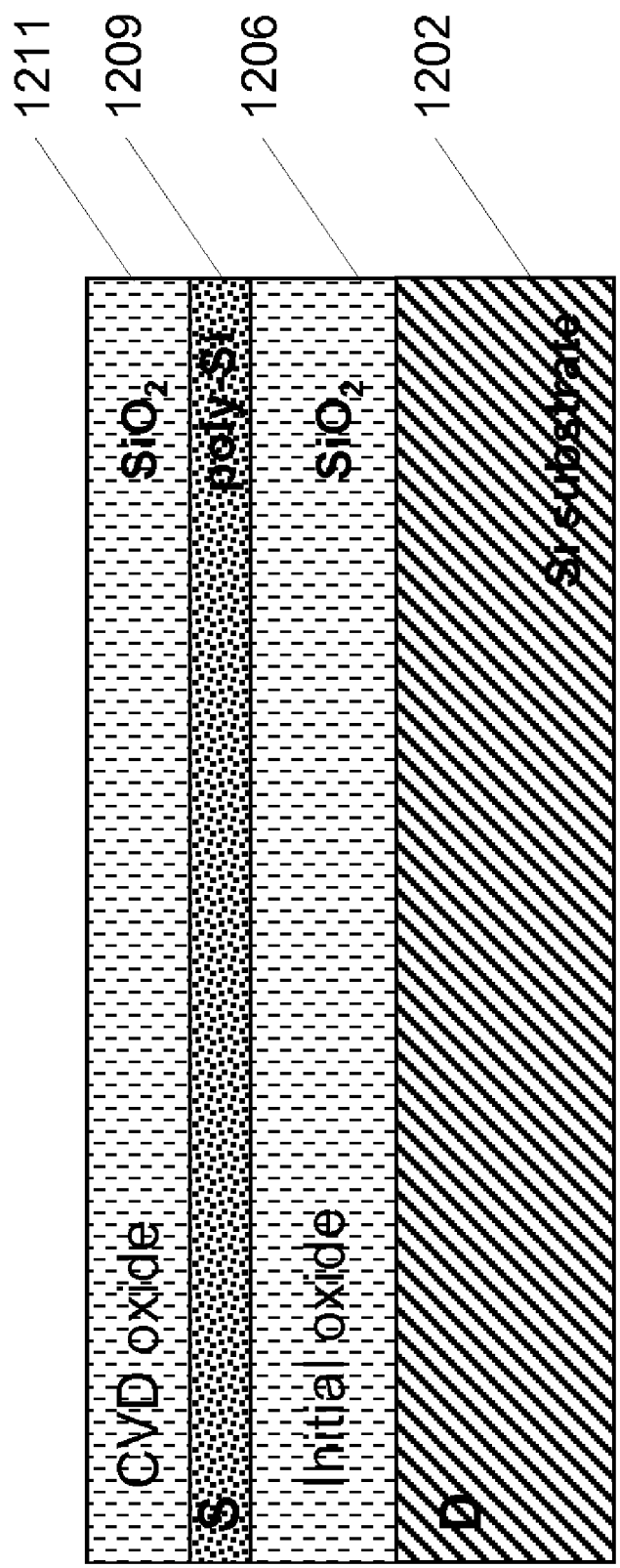
FIGS. 12-26 show a process flow for fabricating a carbon nanotube transistor.

In FIG. 12, a starting material is a silicon wafer substrate 1202. A thermal oxide 1206 of about 0.1 to 0.5 microns is grown or otherwise formed on the substrate. A polysilicon layer 1209 of about 0.1 to 0.5 microns is formed on the oxide. An oxide 1211 of about 0.4 to 1 microns is formed on the polysilicon; this oxide may be referred to as a top oxide and can be formed by chemical vapor deposition (CVD).

The silicon substrate will be the drain of the transistor. The polysilicon will be the source of the transistor. Optionally, other electrodes (not shown) materials, including molybdenum (Mo) or palladium (Pd), may be used to provide improved electrical contacts to the carbon nanotubes.

Figure 13:
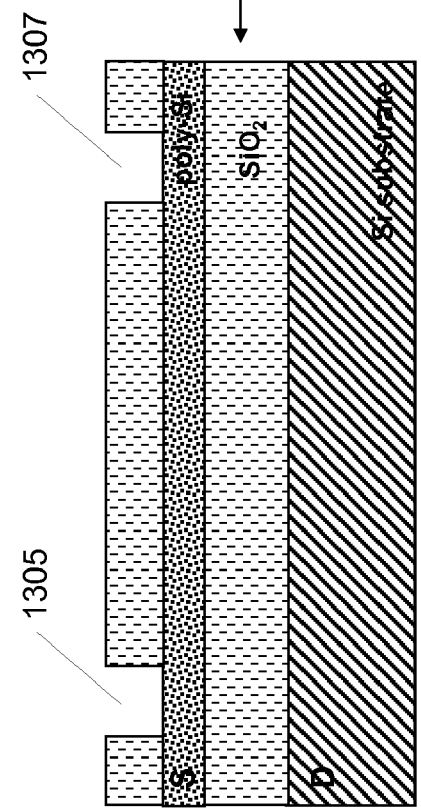

In FIG. 13, vias 1305 and 1307 are etched to enable contact to the source polysilicon layer. This can be performed using a first mask, which may be called a poly-vias mask. Plasma etching or other etching techniques are used to form oxide windows to expose polysilicon source layer. This process step enables palladium electrodeposition on source and eventual source pad contacts.

Figure 14:
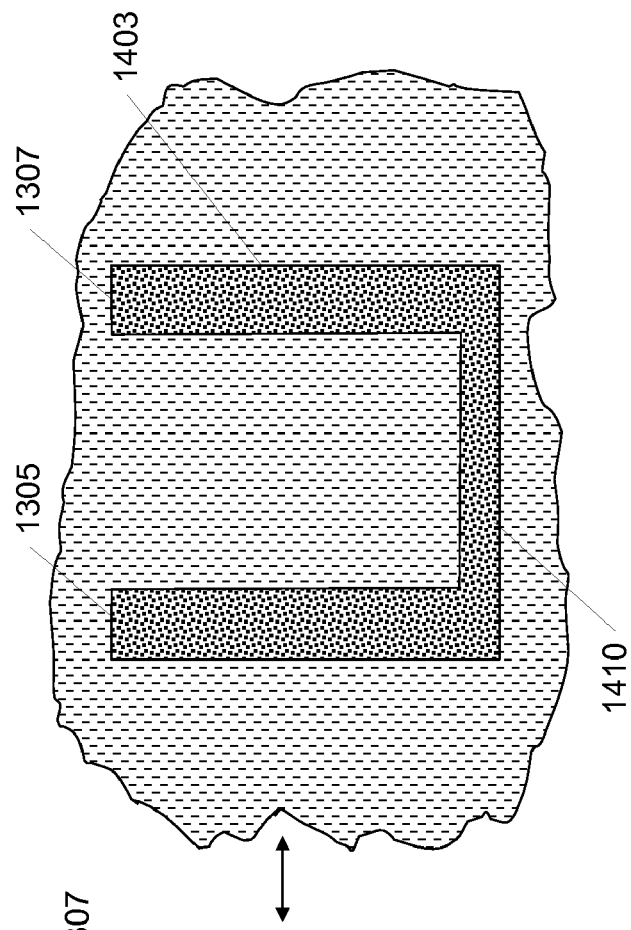

FIG. 14 shows a top view of the structure, showing where oxide 1211 has been etched. The etched oxide region 1403 is generally in the shape of a U or multi-armed structure having two or more parallel arm portions 1305 and 1307, connected by an etched oxide segment 1410.

Figure 15:
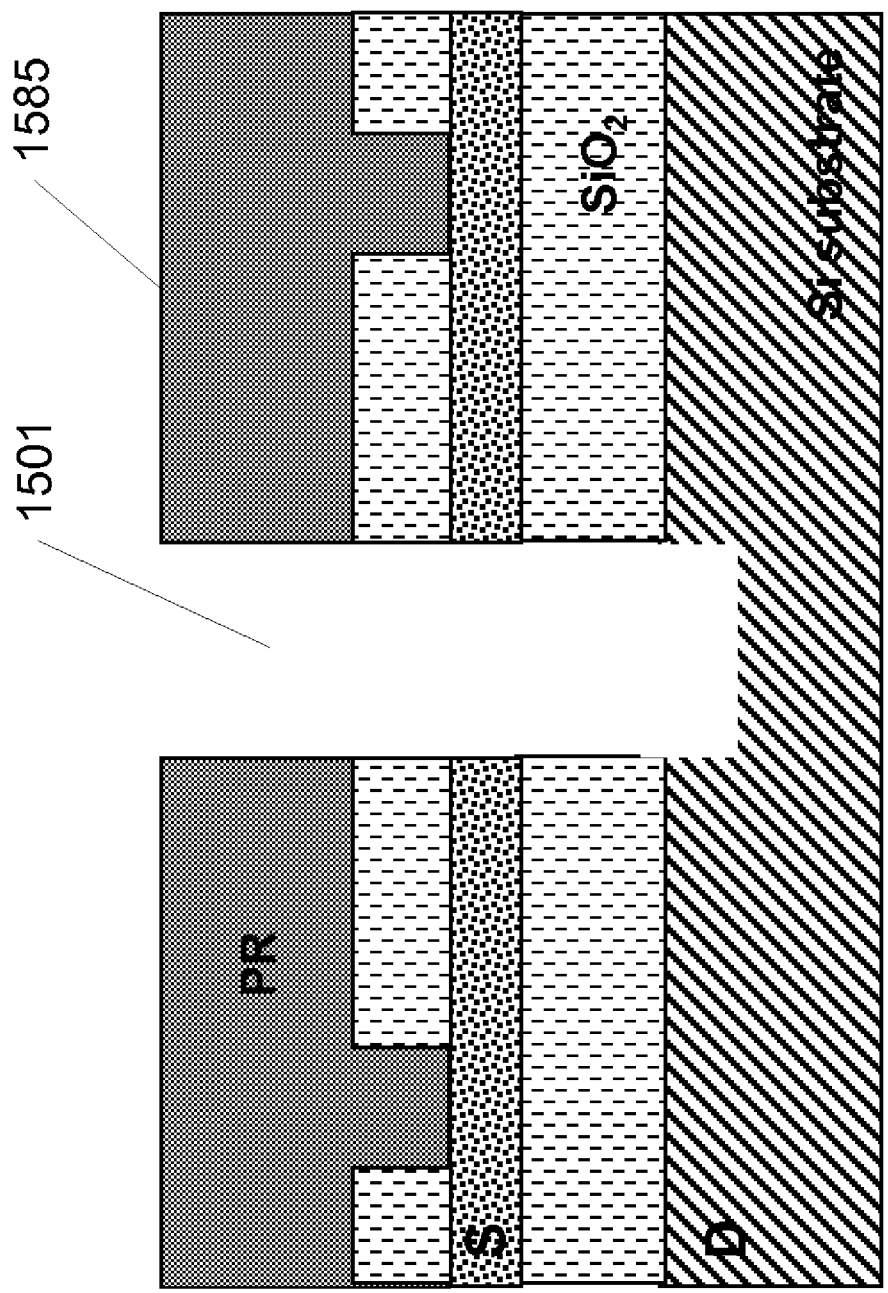

FIG. 15 shows etching slots 1501 (or holes, wells, or trenches). This can be performed through photolithography using photoresist 1585 and a second mask, which may be called a slots mask. Plasma etch (or wet etch) as needed for each layer: top oxide, polysilicon, bottom oxide, and top of wafer. Etch down from about 0.05 to 0.5 microns into silicon wafer to provide initial alignment edge for carbon nanotube growth. Patterns can include many slots in parallel.

Figure 16:
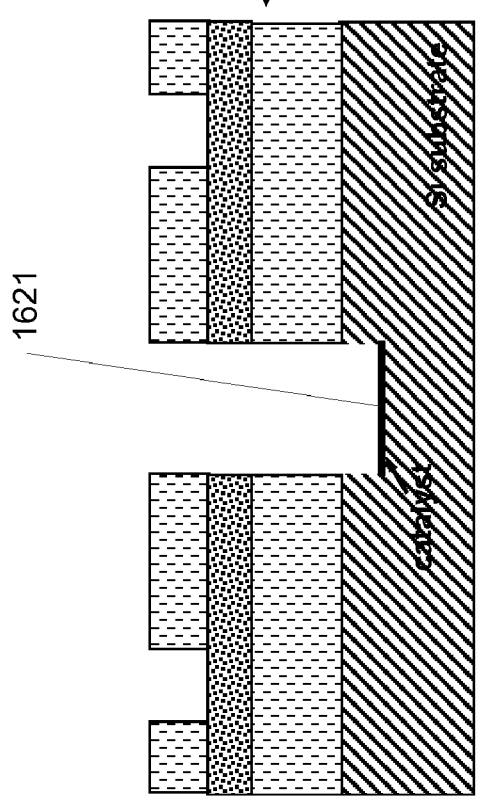

In FIG. 16, using photoresist layer 1585 or a repatterned photoresist layer, lift off (or electrodeposit) catalyst 1621 in bottom of wells (1501). Typically form thin aluminum (about 3-nanometers thick) or titanium nitride (TiN) barrier layer between catalyst and substrate to prevent catalyst reaction with silicon substrate.

The catalyst may be an iron (Fe) layer that is about 0.1 to 0.5 nanometers thick. Other catalysts may be used such as nickel (Ni), cobalt (Co), molybdenum (Mo), or combinations of these by electrodeposition, sputtering, evaporation, or metal nanoparticles, such as surfactant stabilized or in the form of ferritin.

Figure 17:
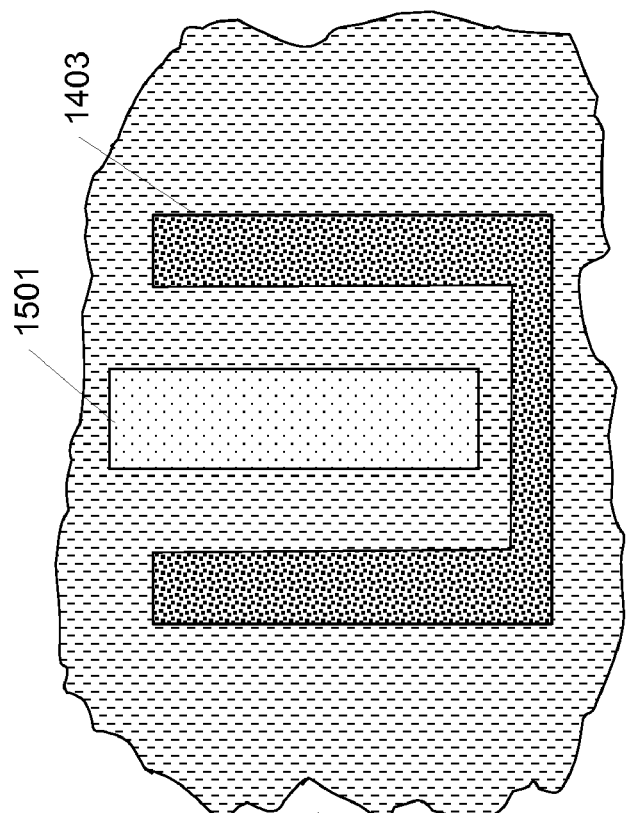

FIG. 17 shows a top view of the structure with etched oxide region 1403 and slot 1501. At least a portion of the slot is between etched oxide arms 1305 and 1307. There may be multiple interdigitated 1501 and 1403 patterns.

Figure 18:
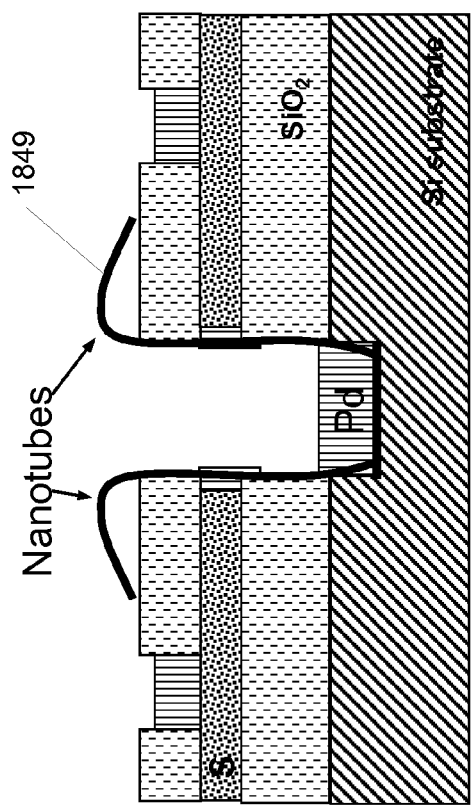

In FIG. 18, single-walled carbon nanotubes 1849 are formed or placed in the well. Nanotubes can be placed along the entire length of slot 1501, on both sides. The single-walled carbon nanotubes (SWNTs) can be grown via chemical vapor deposition. Alternatively, single-walled carbon nanotubes can be placed using dielectrophoresis to deposit prepurified nanotubes from solution.

As part of the process, some metallic carbon nanotubes may be formed. Any metallic tubes that are formed can be removed through methane plasma etch of these tubes. Other treatments may be used remove any metallic tubes. A technique of selectively removing undesirable tubes is discussed in U.S. patent application 61/091,041, which is incorporated by reference, and is applicable to the structures discussed in this patent application.

Electrodeposit palladium (Pd) on silicon electrodes to provide ohmic contact to the nanotubes. This can be done independently for the source and drain. To obtain good ohmic contact from palladium to silicon layers, the silicon can be heavily doped. Also, the silicon surface can be cleaned using hydrofluoric acid (HF or piranha).

An option is to include a titanium silicide ($TiSi_2$) or titanium nitride barrier layer between the palladium and silicon to prevent reaction.

Figure 19:
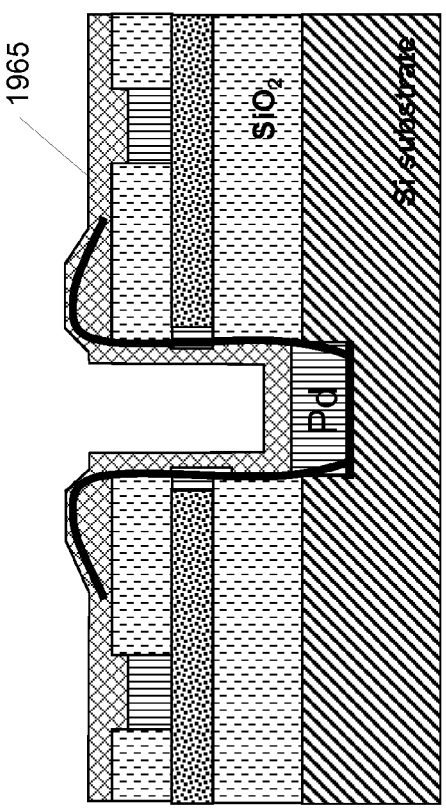

In FIG. 19, deposit an insulator 1965 by atomic layer deposition (ALD), such as aluminum oxide ($Al_2O_3$) or hafnium oxide ($HfO_2$). This is done before any further processing of the tubes to keep the surfaces clean. First deposit by atomic layer deposition appropriate insulator base layer, typically about 10 to 20 nanometers thick. Then oxygen plasma etch to destroy or remove any uncoated tubes and thereby prevent possible gate shorting. Then deposit using atomic layer deposition additional insulator, typically about 10 to 20 nanometers thick.

Figure 20:
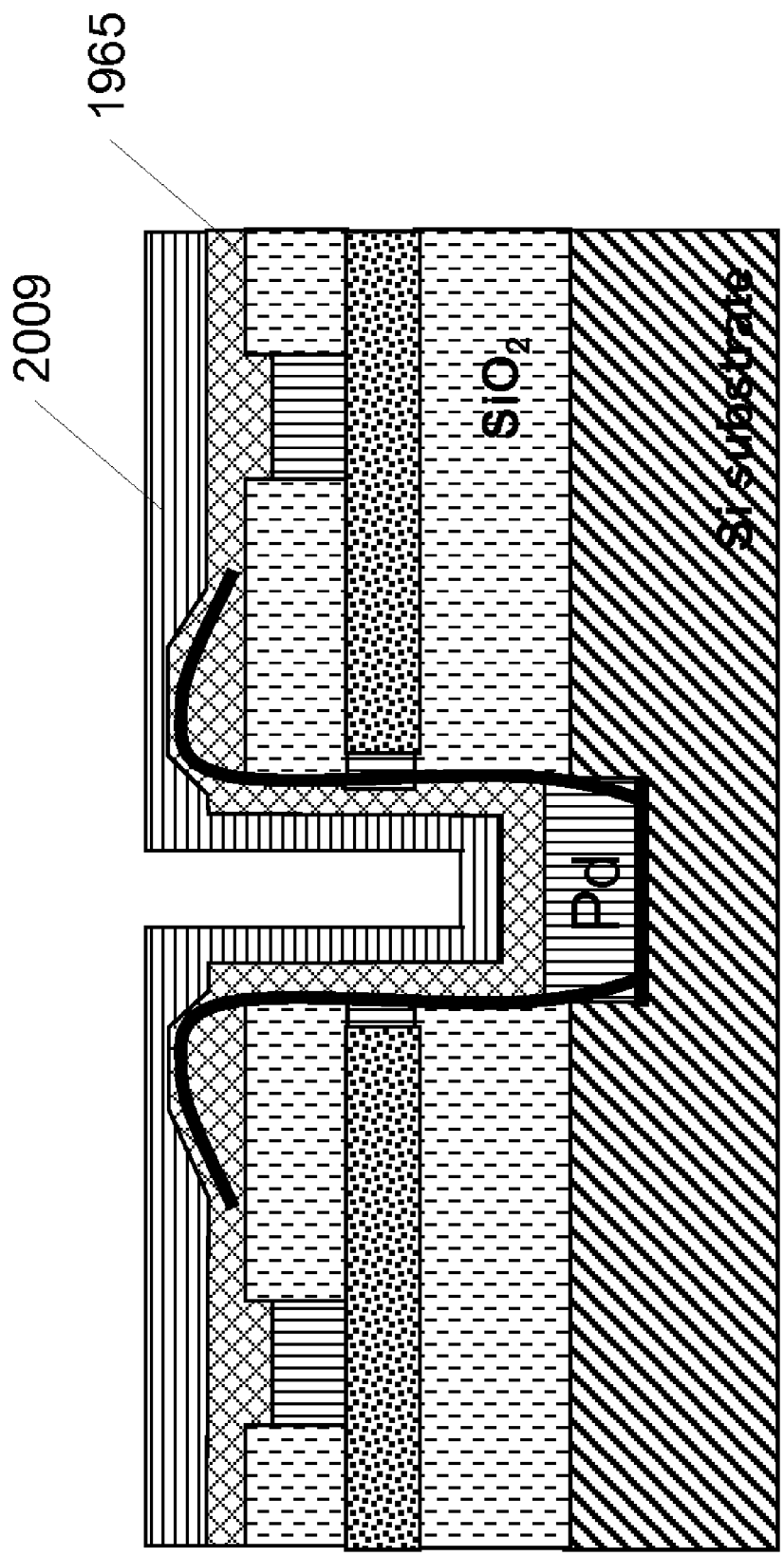

In FIG. 20, deposit a gate metal 2009. This gate metal may be formed using atomic layer deposition, e-beam deposition, or another type of deposition with an appropriate metal or conductor such as platinum (Pt), a titanium gold (Ti/Au)

bilayer, aluminum, polysilicide, polysilicon, and many others. To increase its thickness, can electrodeposit another metal over the initially deposited metal. In an alternative implementation, can grow and use multiwalled or metallic nanotubes as the gate metal.

Figure 21:
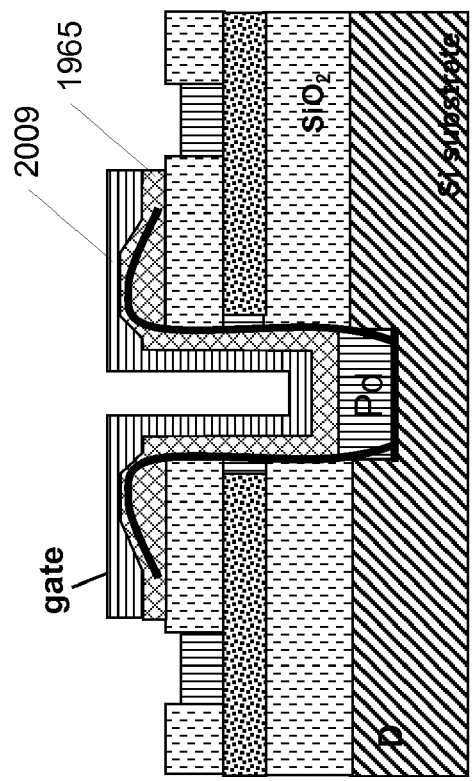

In FIG. 21, pattern gate electrode 2009 and insulator 1965 using plasma etch, wet etch, or other etch steps, and combinations of these. This can be performed using a third mask, which may be called a gate-electrode mask.

Figure 22:
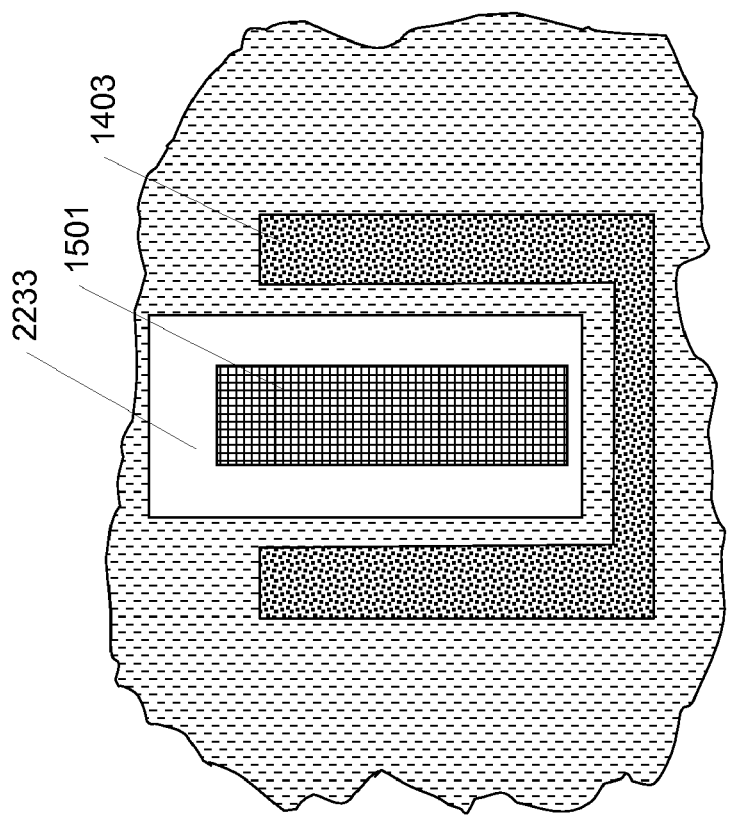

FIG. 22 shows a top view of the patterned gate electrode (2233). The gate electrode surrounds slot 1501 and is between etched oxide region 1403 and slot 1501 as shown.

Figure 24:
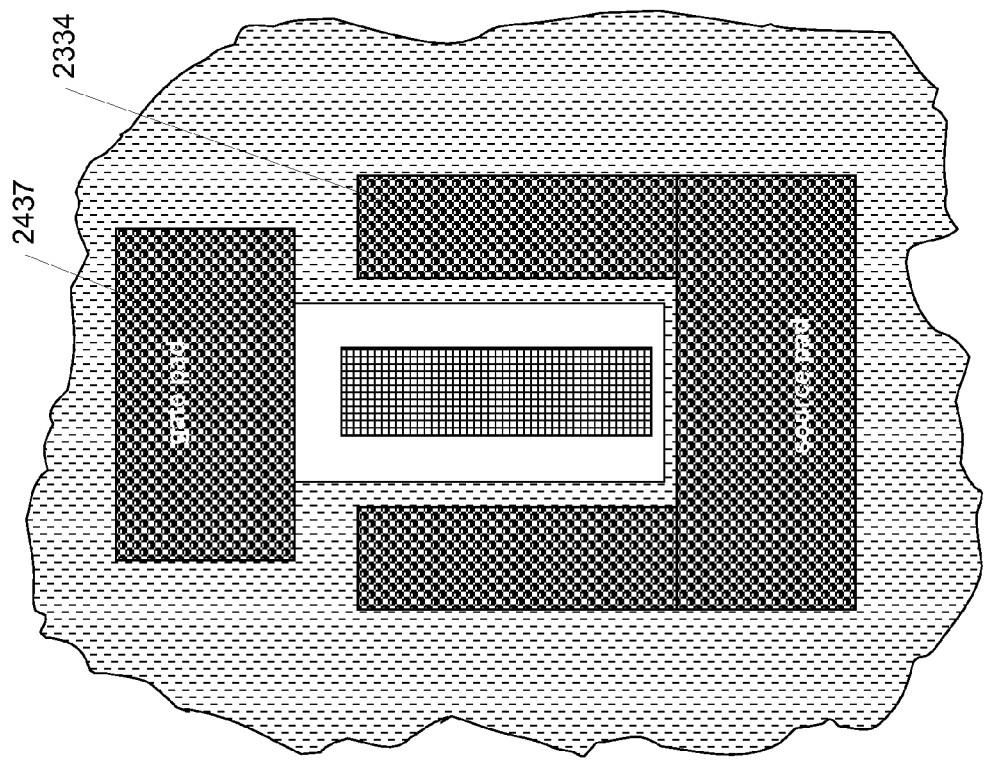
Figure 23:
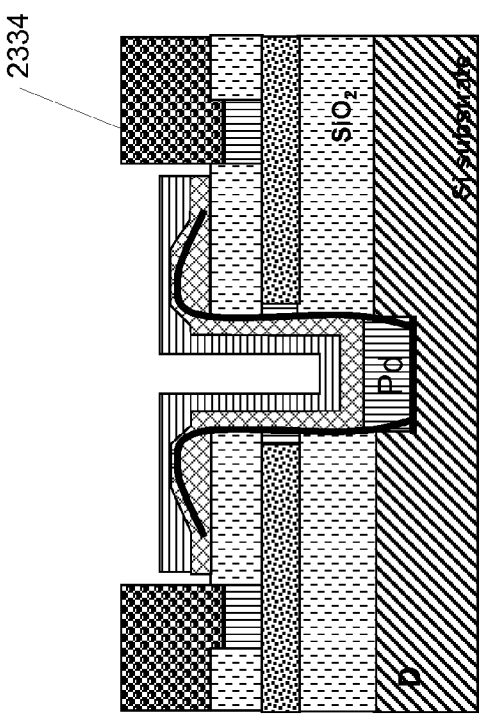

In FIG. 23, define a gate electrode and source pads 2334. FIG. 24 shows a top view of the gate electrode (2437) and source pad 2334. This can be performed using a fourth mask, which may be called a top pads mask.

For good ohmic contact, perform a titanium-platinum-gold (Ti/Pt/Au) liftoff with hydrofluoric acid preclean. Position or locate pads over source dielectric so insulator and pads are thick enough to avoid shorting and probe damage.

Figure 26:
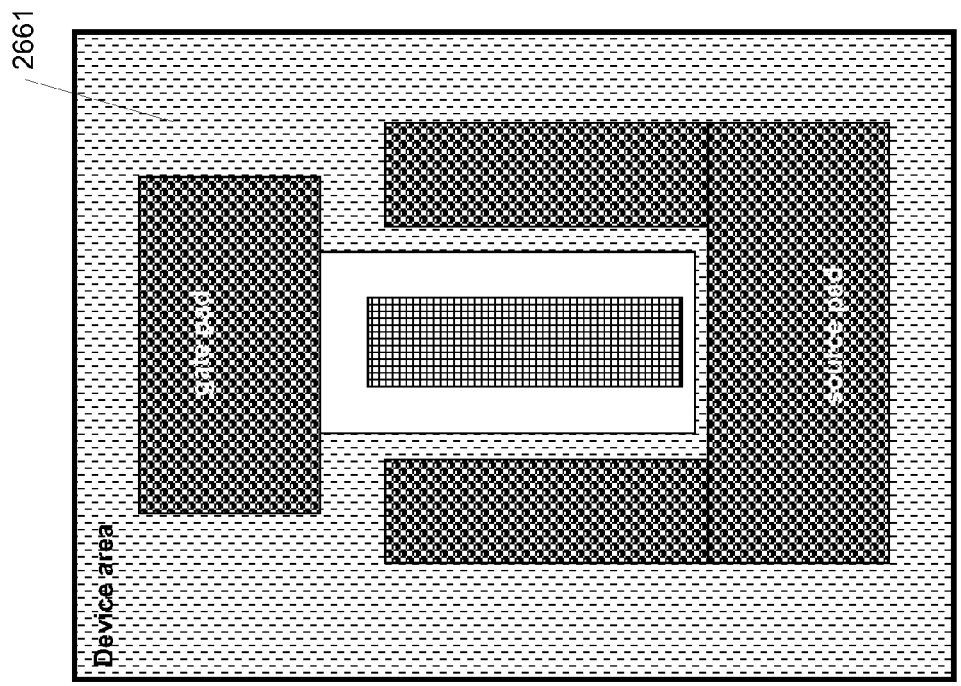
Figure 25:
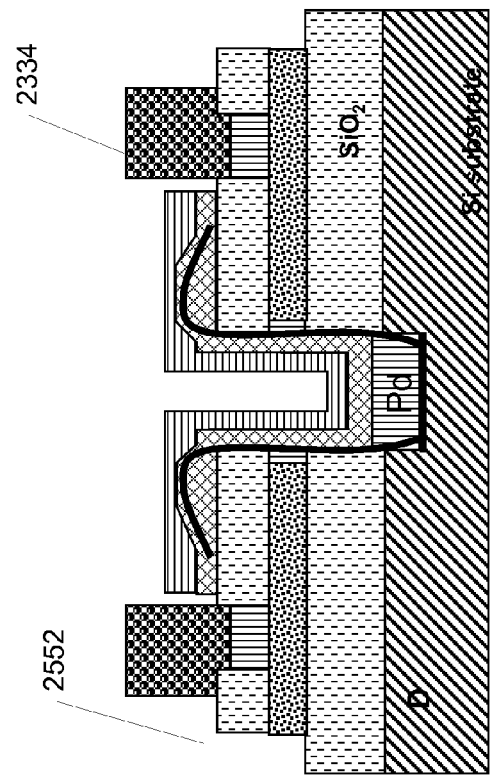

In FIG. 25, define device area. This can be performed using a fifth mask, which may be called a device-isolation mask. Etch through top oxide and polysilicon source layer (2552) to electrically separate all devices. FIG. 26 shows a top view of the device area isolation (2661).

As described above, this process and variations of this process may be used to form any of the structures in this application. For example, to form a lower gate electrode (in FIG. 11), an additional gate layer is formed between the drain and source electrodes. The lower gate electrode can be a layer of a gate material such as a polysilicon, polysilicide, aluminum, gold, titanium, or other conductive material. Between the lower gate electrode and the nanotube is a lower gate electrode dielectric.

Another process flow implementation for fabricating an edge-contacted vertical carbon nanotube transistor device is as follows:

For steps 1-8, refer to FIG. 12 as an example.
1. Starting material: silicon with <1 0 0> orientation and 0.005 ohm-cm resistivity.
2. Initial oxide: 5000 angstroms.
3. Polysilicion CVD: 5000 angstroms, about 580-620 degrees Celsius.
4. Dope poly: about 10-20 ohms per square.
5. Dopant drive: 900 degrees Celsius for 60 minutes in nitrogen.
6. CVD Oxide: 7000 angstroms, undoped.
7. Densify oxide: 900 degrees Celsius for 60 minutes in nitrogen.
8. Backside Grind: (a) tape; (b) grind about 20 microns; and (c) detape.

For steps 9-12, refer to FIGS. 13 and 14 as examples.
9. First photolithography step—source via: (a) photo coat, align, expose, and develop; (b) define electrode contact area for electrodeposition.
10. Plasma etch oxide.
11. Oxygen plasma.
12. Resist strip.

For steps 13-20, refer to FIGS. 15 and 17 as examples.
13. Second photolithography step—active area: photo coat, align, expose, develop.
14. Wet (or plasma) etch oxide.
15. Plasma etch polysilicon.
16. Plasma etch oxide.
17. Plasma etch silicon (about 0.2-0.5 microns); can use deionized water and hydrofluoric acid dip (H-passivated surface).
18. Use aluminum or catalyst deposit step, or both, if resist remains.
19. Oxygen plasma (do not sputter catalyst).
20. Post etch clean.

For steps 21-23, refer to FIG. 18 as an example.
21. Electrodeposit (or lift off) catalyst, probably with thin aluminum (lift off and oxidize) barrier layer. (a) Iron evaporate or lift off. (b) Iron solution or lift off. (c) Lift off by remask, evaporate, and strip.
22. Grow single-walled carbon nanotubes (SWNT).
23. Plasma treatment.

For steps 24-27, refer to FIGS. 19 and 20 as examples.
24. Electrodeposit palladium on silicon electrodes. Able to do independently for source and drain.
25. Vacuum dry oven (e.g., about 1 torr, 400 degrees Celsius)
26. Deposit ALD insulator.
27. Deposit ALD metal.

For steps 28-33, refer to FIGS. 21 and 22 as examples.
28. Third photolithography step—ALD metal and dielectric coat, align, expose, develop.
29. Oxygen descum (if wet etch).
30. Dry etch metal.
31. Dry etch ALD dielectric. ALD over etch into top oxide to remove remnant carbon nanotubes.
32. Post etch clean.
33. Oxygen plasma descum.

For steps 34-39, refer to FIGS. 23 and 24 as examples.
34. Fourth photolithography step-pad metal: Ti/Pt/Au lift off to ensure adhesion to ALD metal. Handle any metal shorts to remnant carbon nanotubes. Coat, align, expose, and develop.
35. Oxygen descum (for resist). Can remove surface oxide from ALD metal.
36. Evaporate metal (about 0.5-1.0 microns). The metal can be 50 angstroms titanium and 5000 angstroms gold.
37. Lift off.
38. Postetch clean.
39. Oxygen plasma descum.

For steps 40-44, refer to FIGS. 25 and 26 as examples.
40. Fifth photolithography step—define device area: coat, align, expose, and develop.
41. Plasma etch oxide.
42. Plasma etch poly
43. Oxygen descum.
44. Resist strip.

This description of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications. This description will enable others skilled in the art to best utilize and practice the invention in various embodiments and with various modifications as are suited to a particular use. The scope of the invention is defined by the following claims.

The invention claimed is:

1. A device comprising:
a first electrode;
a second electrode;
a first gate electrode, between the first and second electrodes and separated from the first electrode by a first insulator and separated from the second electrode layer by a second insulator;

a first nanotube, coupled to and extending from the first and second electrodes, wherein the first nanotube is separated from the first gate electrode by a first gate insulator;
a second gate insulator covering the first nanotube and extending from the first to the second electrodes;
a second gate electrode covering the second gate insulator and first nanotube, and extending from the first to the second electrodes,
wherein the first gate electrode is a separate electrode from the second gate electrode.

2. The device of claim 1 wherein the first gate electrode and second electrode are above the first electrode, and the first nanotube is oriented approximately perpendicular to a substrate on which the device is formed.

3. The device of claim 1 wherein the first, second, and first gate electrodes are along a sidewall of a trench.

4. The device of claim 1 wherein the nanotube is a single-walled carbon nanotube.

5. An electronic system comprising a device of claim 1.

6. The device of claim 1 wherein the first nanotube is formed in a trench, and the device further comprises:
a third electrode;
a fourth electrode;
a second gate electrode, between the third and fourth electrodes and separated from the third electrode by a first insulator and separated from the fourth electrode layer by a second insulator; and
a second nanotube in the trench, coupled to and extending from the third and fourth electrodes, wherein the second nanotube is separated from the second gate electrode by a second gate insulator.

7. A device comprising:
a trench comprising a first sidewall and a second sidewall, wherein the first sidewall comprises:
a first electrode layer;
a second electrode layer, above the first electrode layer; and
a first insulating separating the first and second layers, wherein the second sidewall comprises:
a third electrode layer;
a fourth electrode layer, above the third electrode layer; and
a second insulating separating the third and fourth layers;
a first nanotube in the trench, coupled to the first and second electrode layers;
a second nanotube in the trench, coupled to the third and fourth electrode layers;
a gate insulator layer covering the first and second nanotubes; and
a gate electrode layer covering the gate insulator layer and the first and second nanotubes.

8. The device of claim 7 wherein a slope of the first sidewall of the trench, relative to a surface of a substrate on which the device is formed, is from about 38 degrees to about 60 degrees.

9. The device of claim 7 wherein a slope of the first sidewall of the trench, relative to a surface of a substrate on which the device is formed, is from about 80 degrees to about 90 degrees.

10. The device of claim 7 wherein the first and second nanotubes are single-walled carbon nanotubes.

11. The device of claim 7 wherein a width of the trench is at least about 500 angstroms.

12. The device of claim 7 wherein a depth of the trench is at least about 0.2 microns.

13. The device of claim 7 wherein the gate electrode layer has a first slope for covering the first sidewall, a second slope for covering the second sidewall, and a third slope for covering a bottom of the trench, the third slope being different from the first and second slope.

14. The device of claim 13 wherein third slope is substantially perpendicular to the first slope.

15. The device of claim 7 wherein the first sidewall further comprises a first side gate electrode layer between the first and second electrode layers, and the second sidewall further comprises a second side gate electrode layer between the third and fourth electrode layers, and between the first side gate electrode layer and the first nanotube is a first side gate insulator and between the second side gate electrode layer and the second nanotube is a second side gate insulator.

16. An electronic system comprising a device of claim 7.

17. The device of claim 7 wherein the gate electrode layer is a first gate electrode layer and the first sidewall further comprises:
a second gate electrode layer, between the first and second electrode layers.

18. The device of claim 17 wherein the second sidewall further comprises:
a third gate electrode layer, between the third and fourth electrode layers.

19. A device comprising:
a first electrode;
a second electrode;
a first gate electrode, between the first and second electrodes and separated from the first electrode by a first insulator and separated from the second electrode layer by a second insulator;
a first nanotube in a trench, coupled to and extending from the first and second electrodes, wherein the first nanotube is separated from the first gate electrode by a first gate insulator;
a third electrode;
a fourth electrode;
a second gate electrode, between the third and fourth electrodes and separated from the third electrode by a first insulator and separated from the fourth electrode layer by a second insulator; and
a second nanotube in the trench, coupled to and extending from the third and fourth electrodes, wherein the second nanotube is separated from the second gate electrode by a second gate insulator.

20. The device of claim 19 comprising:
a third gate insulator covering the first and second nanotubes, extending from the first to the second electrodes, and extending from the third to the fourth electrodes; and
a third gate electrode covering the third gate insulator and first and second nanotubes, extending from the first to the second electrodes, and extending from the third to the fourth electrodes.

21. The device of claim 19 wherein the first gate electrode is a separate electrode from the second gate electrode.

22. The device of claim 20 wherein the first gate electrode is a separate electrode from the third gate electrode.

23. A method comprising:
providing a substrate;
forming a first electrode layer above the substrate;
forming a second electrode layer above the first electrode layer;
forming a first gate electrode, between the first and second electrodes;
forming a first insulator layer separating the first electrode layer and first gate electrode;
forming a second insulator layer separating the second electrode layer and first gate electrode;
forming a trench extending into the first electrode, second electrode, and first insulator layers; and forming a first carbon nanotube extending from the first to the second electrode, wherein the first carbon nanotube electrically contacts the first and second electrodes forming a first gate insulator separating the first carbon nanotube and the first gate electrode forming a second gate insulator covering the first carbon nanotube and extending from the first to the second electrodes;

forming a second gate electrode covering the second gate insulator and first nanotube, and extending from the first to the second electrodes, wherein the first gate electrode is a separate electrode from the second gate electrode.

24. The method of claim 23 wherein before forming a first carbon nanotube, depositing a catalyst at a bottom of the trench.

25. The method of claim 23 wherein the first carbon nanotube is positioned to contact the first and second electrode layers on a first side of the trench and the method further comprises:

forming a second carbon nanotube extending from the first to the second electrode on the first side of the trench, wherein the first carbon nanotube electrically contacts the first and second electrodes on the first side.

26. The method of claim 25 comprising:

forming a third carbon nanotube extending from the first to the second electrode on a second side of the trench, wherein the third carbon nanotube electrically contacts the first and second electrodes on the second side.

27. The method of claim 23 wherein the first carbon nanotube is positioned to contact the first and second electrode layers on a first side of the trench and the method further comprises:

forming a second carbon nanotube extending from the first to the second electrode on a second side of the trench, wherein the second carbon nanotube electrically contacts the first and second electrodes on the second side.

28. The method of claim 25 wherein the second gate electrode covers the first and second carbon nanotubes and extends from first to second sides of the trench.

29. The method of claim 23 wherein a slope of a first side of the trench, relative to a surface of the substrate, is from about 38 degrees to about 60 degrees.

30. The method of claim 27 comprising:

forming a second gate electrode layer between the source and drain electrode layers.

31. The method of claim 23 comprising:

forming a third electrode layer above the second electrode layer, wherein the third electrode layer is electrically coupled to the first carbon nanotube.

* * * * *